(12) United States Patent
Fukasawa

(10) Patent No.: US 10,591,141 B2
(45) Date of Patent: Mar. 17, 2020

(54) LIGHT-EMITTING APPARATUS WITH INCLINED LIGHT-EMITTING UNITS

(71) Applicants: CITIZEN ELECTRONICS CO., LTD., Fujiyoshida-shi, Yamanashi (JP); CITIZEN WATCH CO., LTD., Tokyo (JP)

(72) Inventor: Koichi Fukasawa, Kofu (JP)

(73) Assignees: Citizen Electronics Co., Ltd., Yamanashi (JP); Citizen Watch Co., Ltd., Tokyo (JP)

( * ) Notice: Subject to any disclaimer, the term of this patent is extended or adjusted under 35 U.S.C. 154(b) by 189 days.

(21) Appl. No.: 15/655,301

(22) Filed: Jul. 20, 2017

(65) Prior Publication Data

US 2018/0128458 A1 May 10, 2018

(30) Foreign Application Priority Data

Jul. 21, 2016 (JP) .................................. 2016-143502
Jul. 11, 2017 (JP) .................................. 2017-135640

(51) Int. Cl.
*H01L 25/075* (2006.01)
*F21V 19/00* (2006.01)
(Continued)

(52) U.S. Cl.
CPC ............ *F21V 19/0015* (2013.01); *F21K 9/64* (2016.08); *F21V 5/007* (2013.01); *F21V 29/76* (2015.01);
(Continued)

(58) Field of Classification Search
CPC ............. F21Y 2105/12; F21Y 2105/14; F21Y 2105/16; F21Y 2105/18; F21V 5/007
See application file for complete search history.

(56) References Cited

U.S. PATENT DOCUMENTS 8,461,613 B2 * 6/2013 Chou ..................... H05B 33/12
257/88
9,797,571 B2 * 10/2017 Adams .................... F21V 5/007
(Continued)

FOREIGN PATENT DOCUMENTS

JP 2002304903 A 10/2002
JP 2006005290 1/2006
(Continued)

*Primary Examiner* — Anh T Mai
*Assistant Examiner* — Michael Chiang
(74) *Attorney, Agent, or Firm* — RatnerPrestia

(57) ABSTRACT

Provided is a light-emitting apparatus including a substrate, a plurality of light-emitting units each having a plurality of LED elements mounted on the substrate in a rectangular lattice pattern, wherein each of the light-emitting units has a rectangular light-emitting region, and a lens array including a plurality of lenses provided corresponding to the light-emitting units, respectively, the lens array being arranged on the plurality of light-emitting units, wherein the plurality of lenses is designed such that beams of emission light from the plurality of light-emitting units are collected and radiated so as to overlap with one another at a position distant from the substrate, and a part of the plurality of light-emitting units is arranged to be inclined with respect to a reference direction in a plane of the substrate by an angle different from that of other light-emitting units.

9 Claims, 22 Drawing Sheets

(51) Int. Cl.
*F21V 29/76* (2015.01)
*F21K 9/64* (2016.01)
*F21V 5/00* (2018.01)
*H01L 33/58* (2010.01)
*F21Y 105/16* (2016.01)
*F21Y 115/10* (2016.01)

(52) U.S. Cl.
CPC ...... *H01L 25/0753* (2013.01); *F21Y 2105/16* (2016.08); *F21Y 2115/10* (2016.08); *H01L 33/58* (2013.01)

(56) References Cited

U.S. PATENT DOCUMENTS

| | | | |
|---|---|---|---|
| 2002/0024821 A1* | 2/2002 | Yen | F21K 9/00 362/555 |
| 2005/0068786 A1* | 3/2005 | Ishida | F21V 5/04 362/509 |
| 2006/0001361 A1 | 1/2006 | Imai et al. | |
| 2008/0084694 A1* | 4/2008 | Rose | F21V 5/04 362/240 |
| 2010/0244061 A1 | 9/2010 | Shirakawa et al. | |
| 2012/0320102 A1* | 12/2012 | Jorgensen | F21S 10/007 345/690 |
| 2013/0009179 A1* | 1/2013 | Bhat | H05K 1/0209 257/89 |
| 2013/0093362 A1* | 4/2013 | Edwards | H01L 25/0753 315/313 |
| 2013/0265752 A1* | 10/2013 | Shimizu | F21V 5/007 362/231 |
| 2014/0185290 A1* | 7/2014 | McDaniel, Jr. | F21V 5/007 362/244 |
| 2014/0191655 A1* | 7/2014 | Kasakura | H01L 25/0753 315/32 |
| 2015/0159841 A1* | 6/2015 | Logan | F21V 21/30 362/249.03 |

FOREIGN PATENT DOCUMENTS

| | | |
|---|---|---|
| JP | 2008258094 A | 10/2008 |
| JP | 2009038302 A | 2/2009 |
| JP | 2010170945 A | 8/2010 |
| JP | 2010231938 A | 10/2010 |
| JP | 2011134508 A | 7/2011 |
| JP | 2012042670 A | 3/2012 |
| JP | 2012109140 A | 6/2012 |
| JP | 2013178946 A | 9/2013 |

* cited by examiner

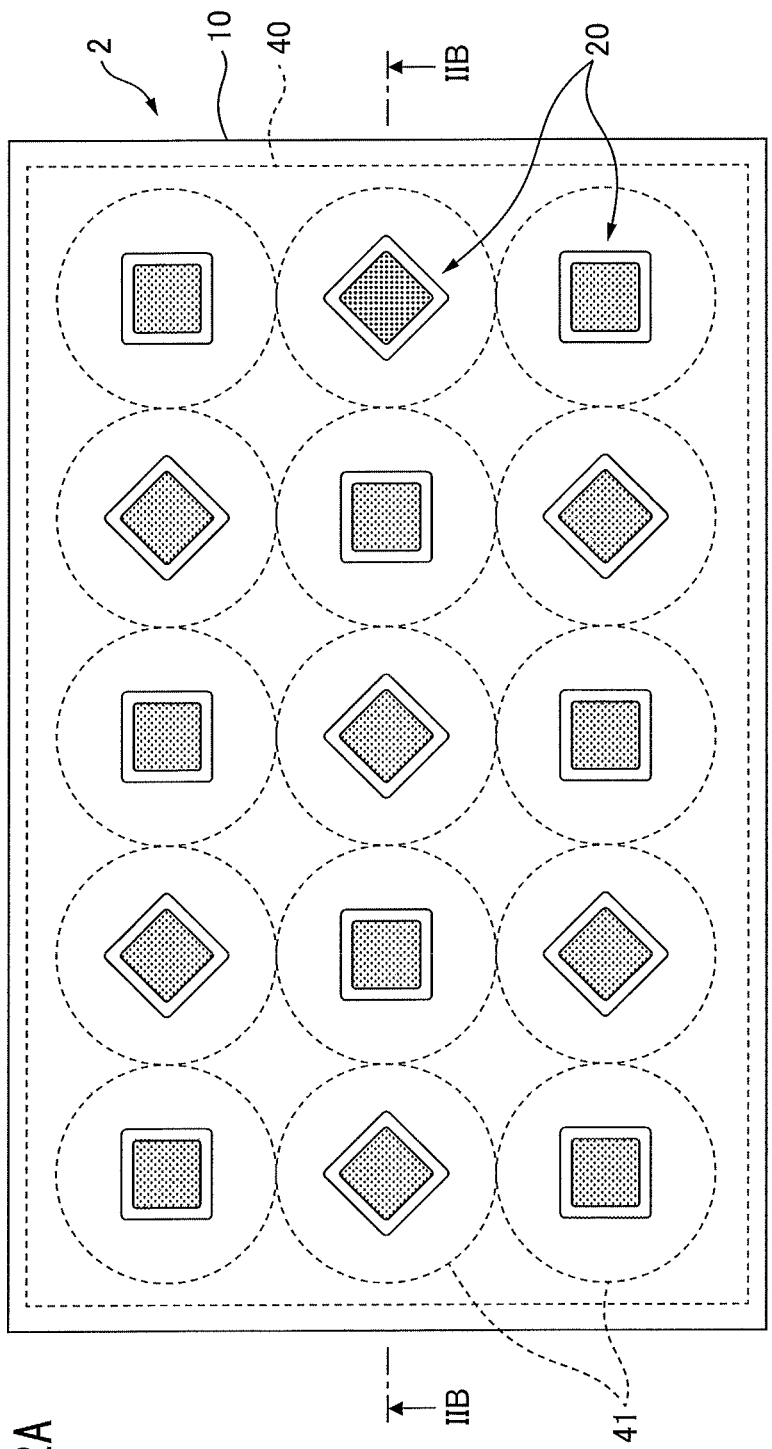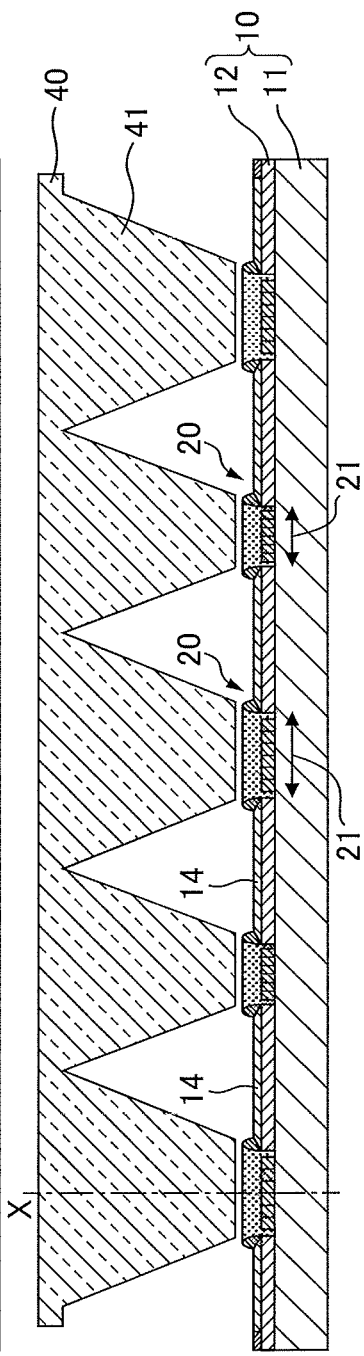

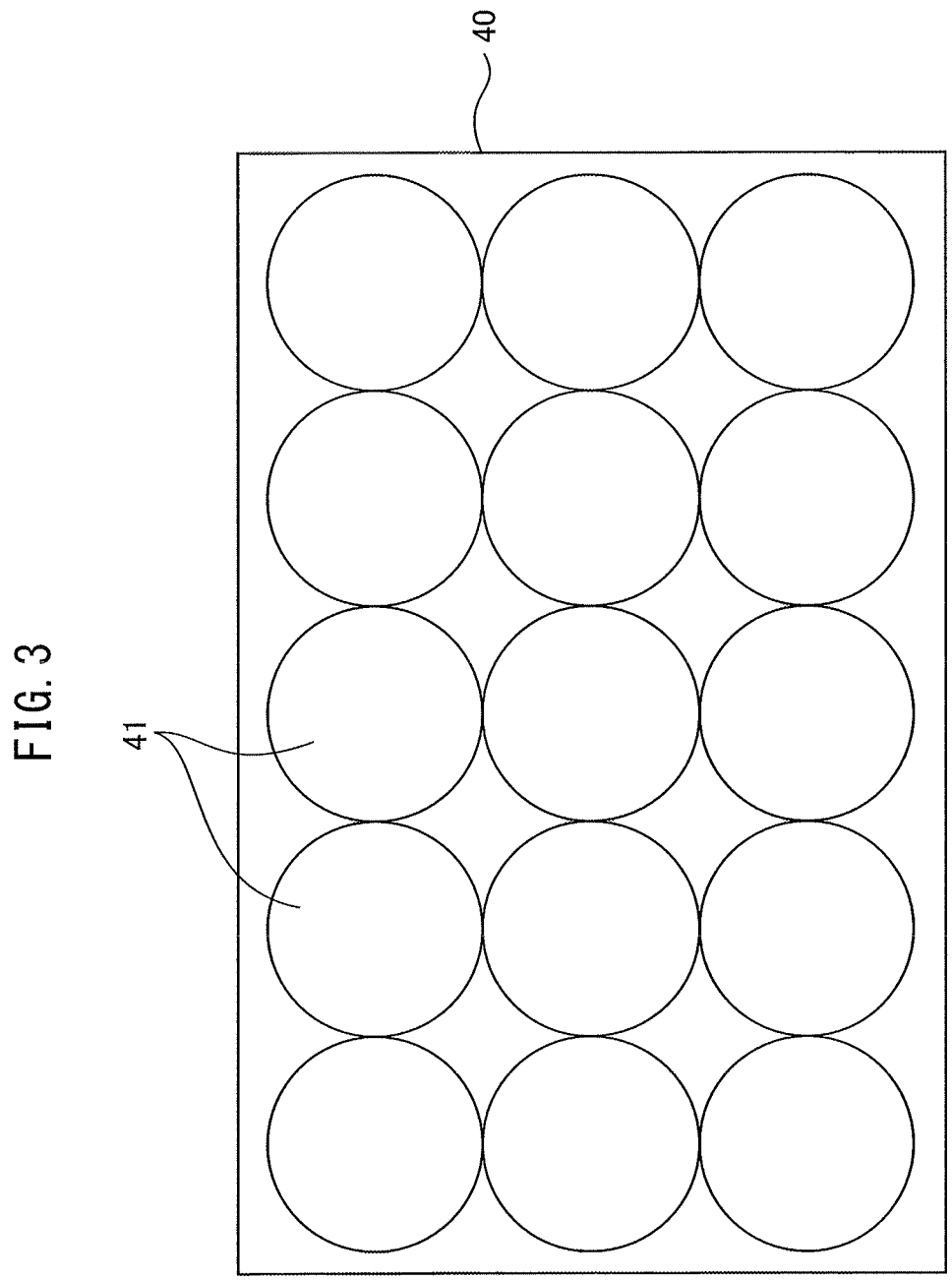

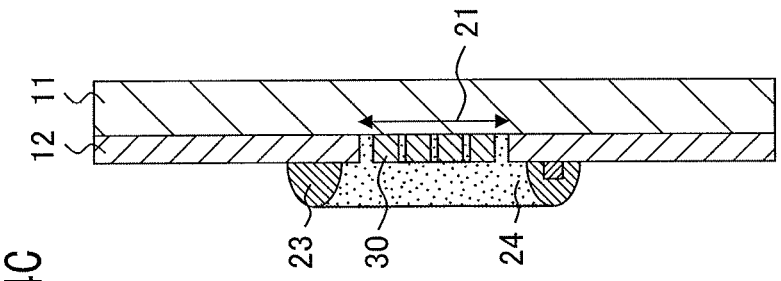
FIG. 4C
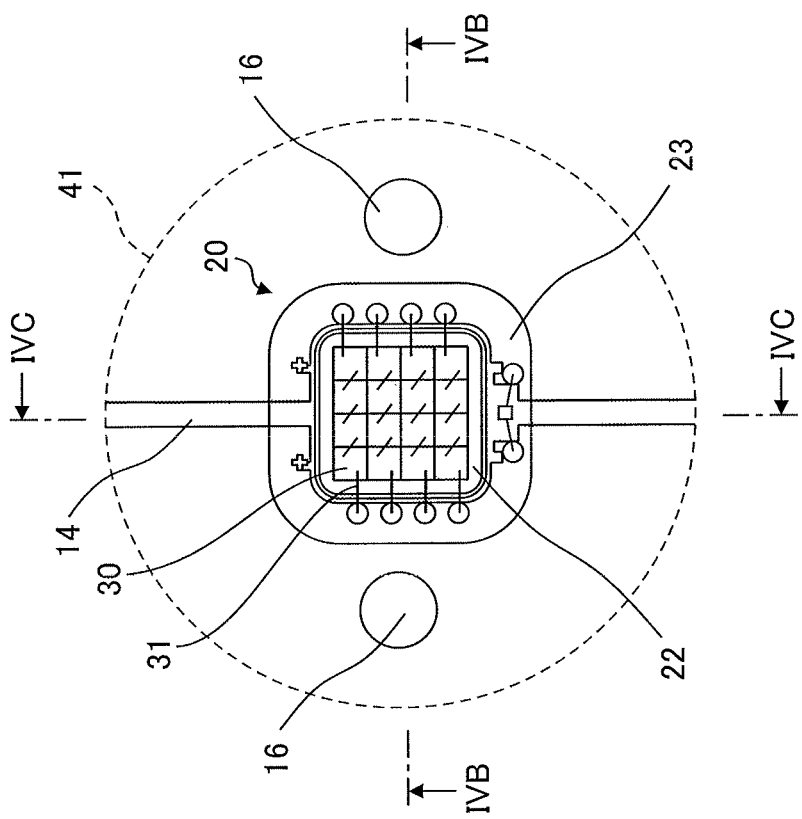
FIG. 4A
FIG. 4B

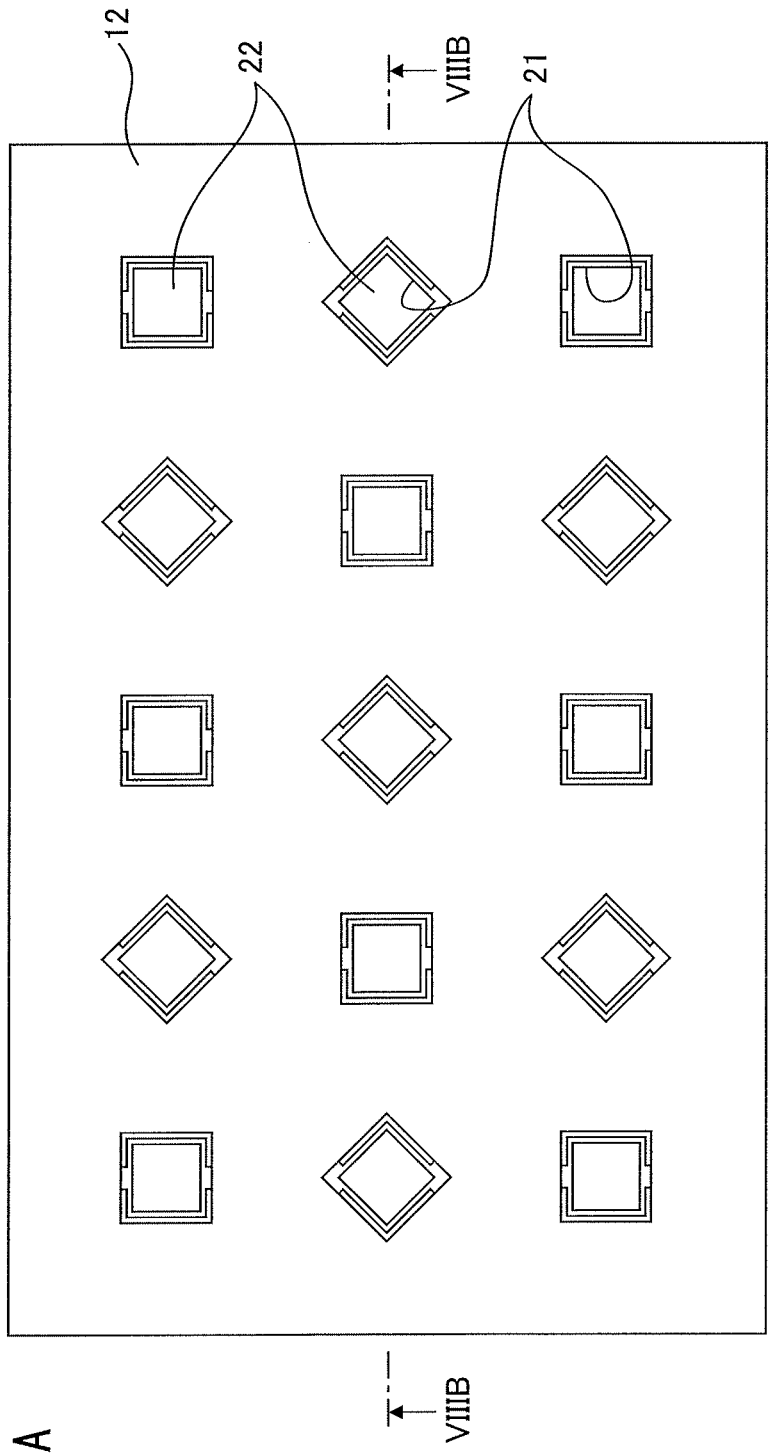
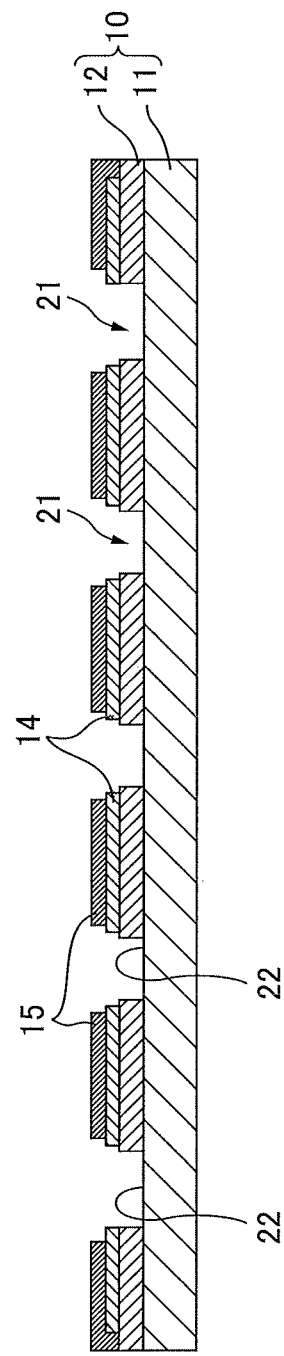
FIG. 8A
FIG. 8B

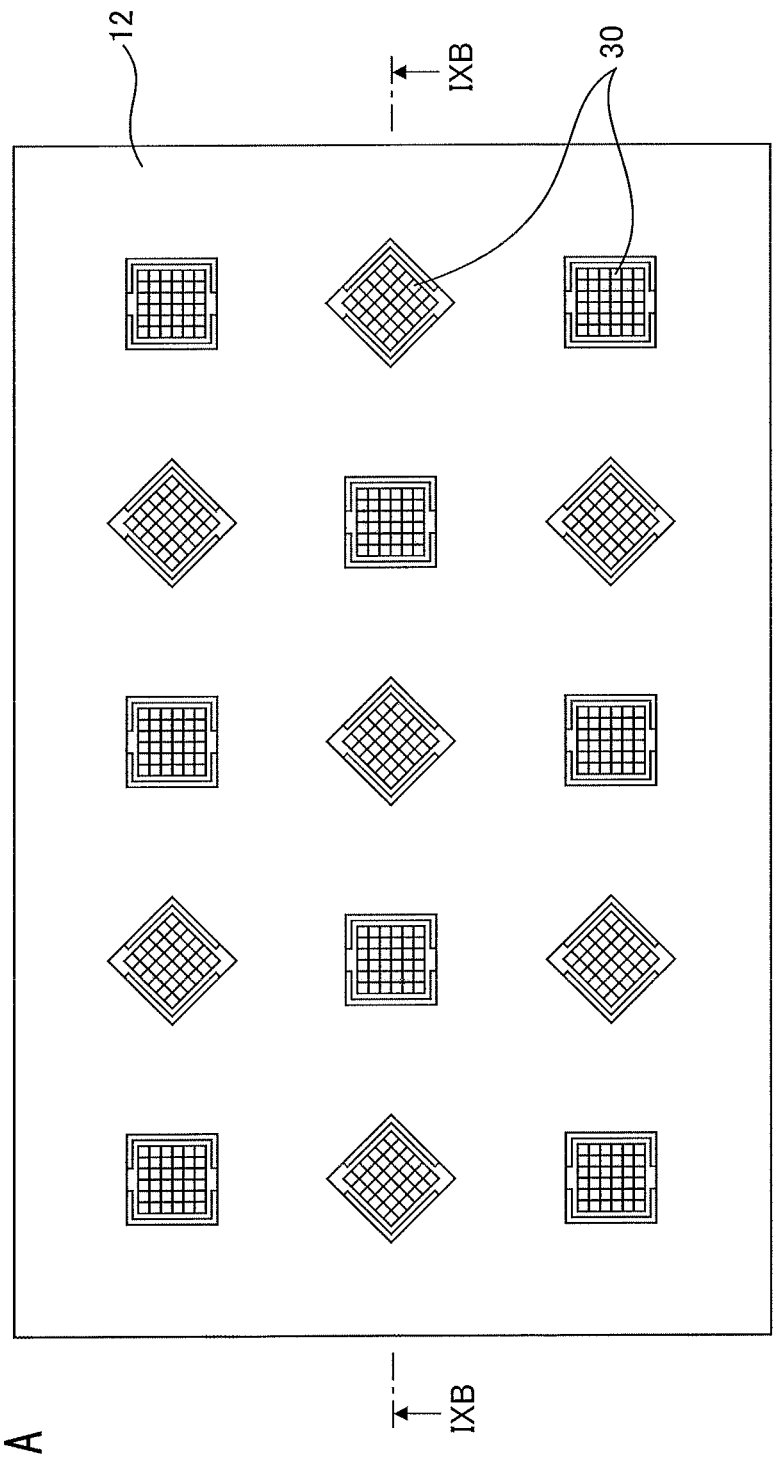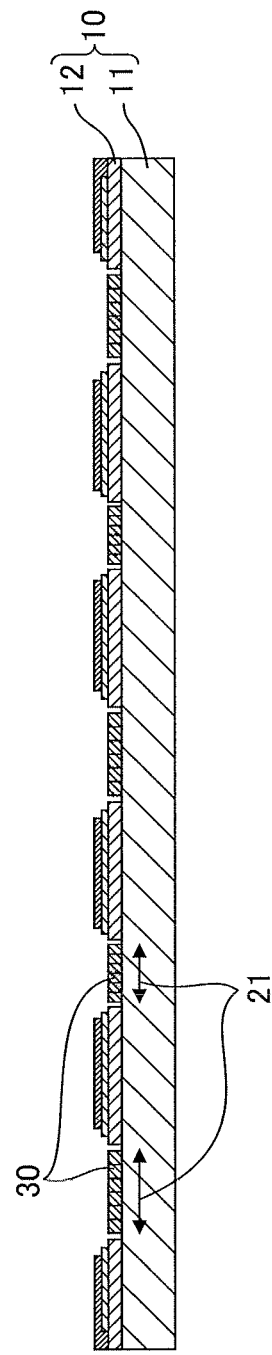
FIG. 9A
FIG. 9B

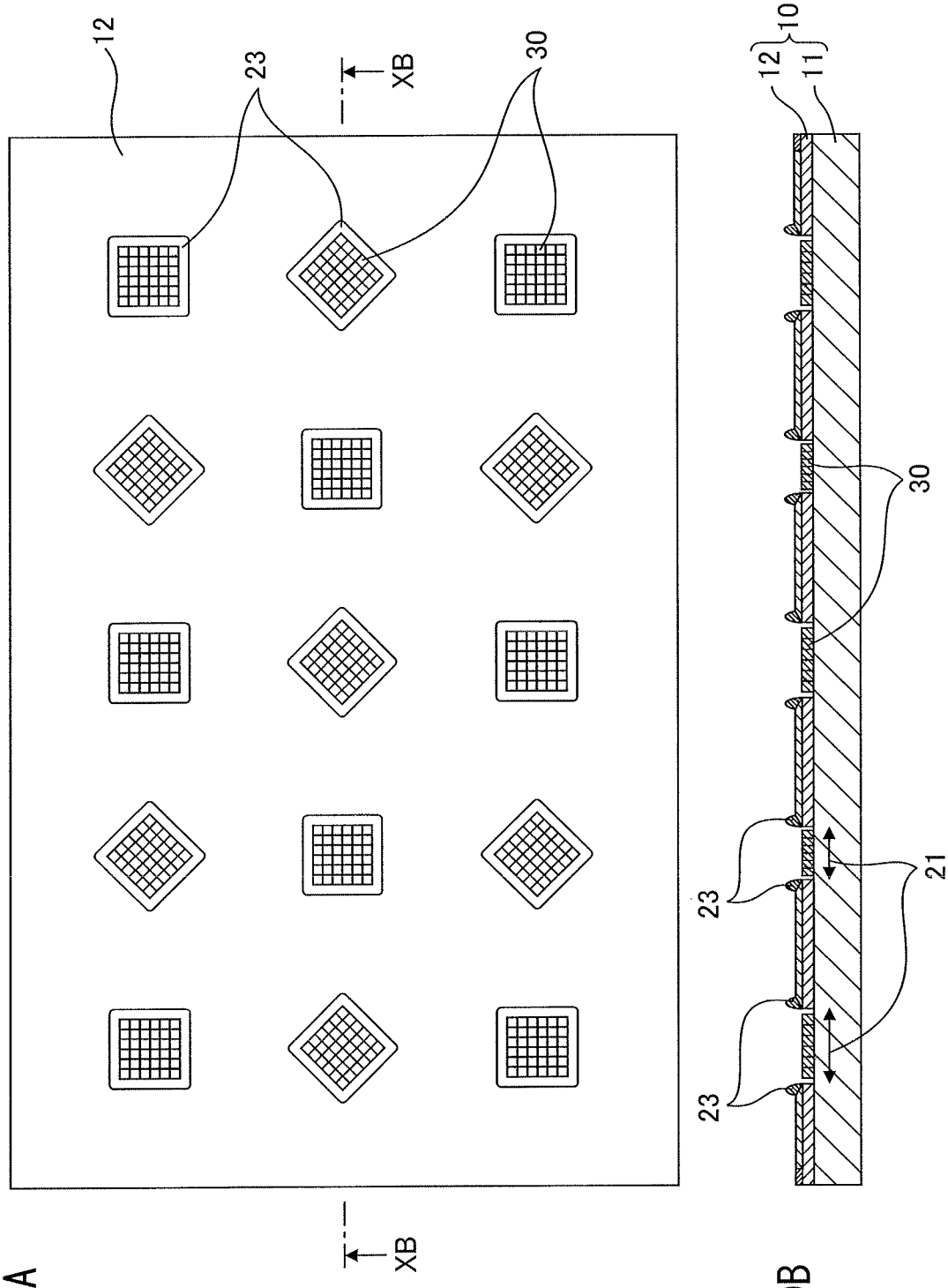

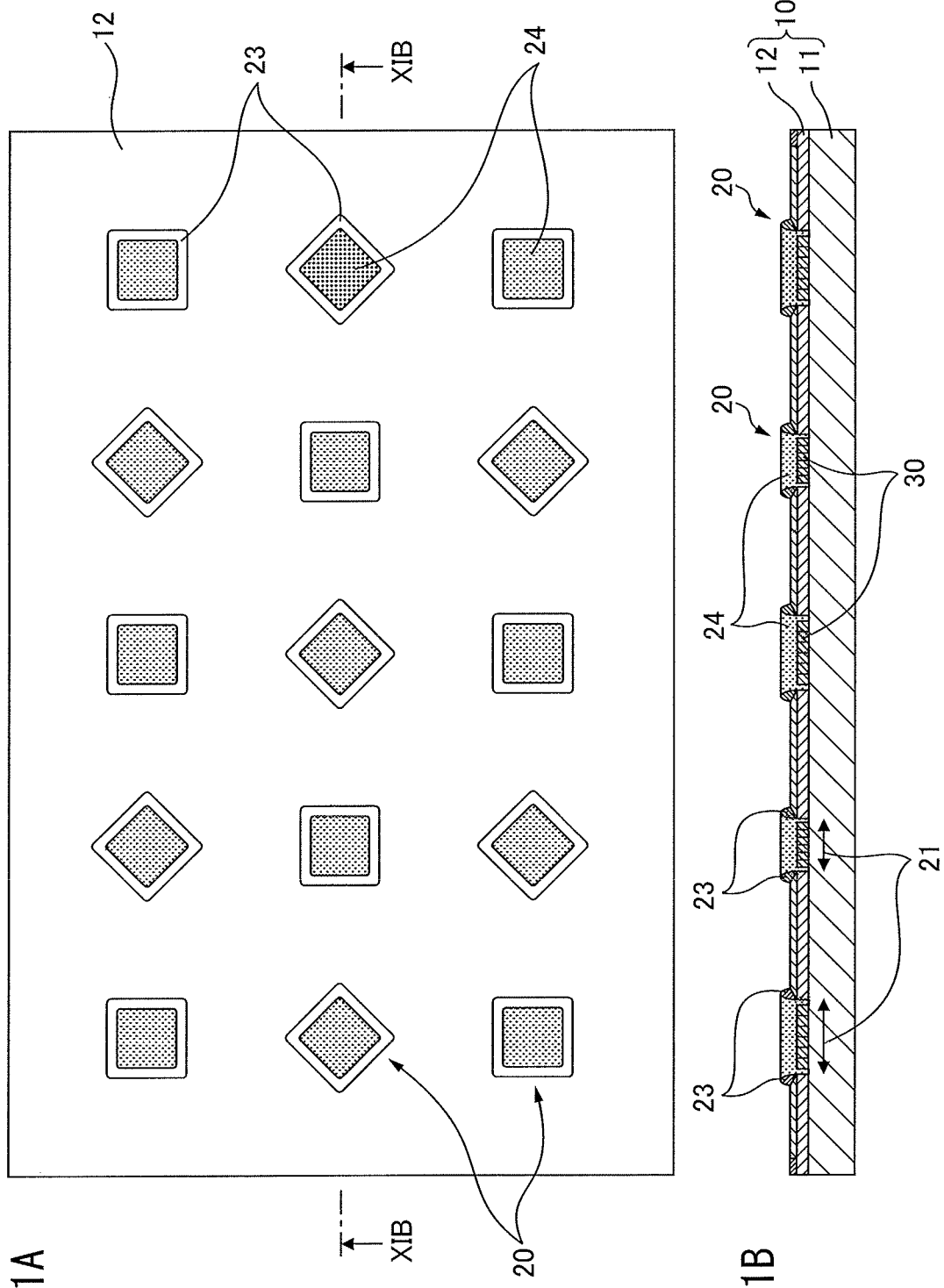

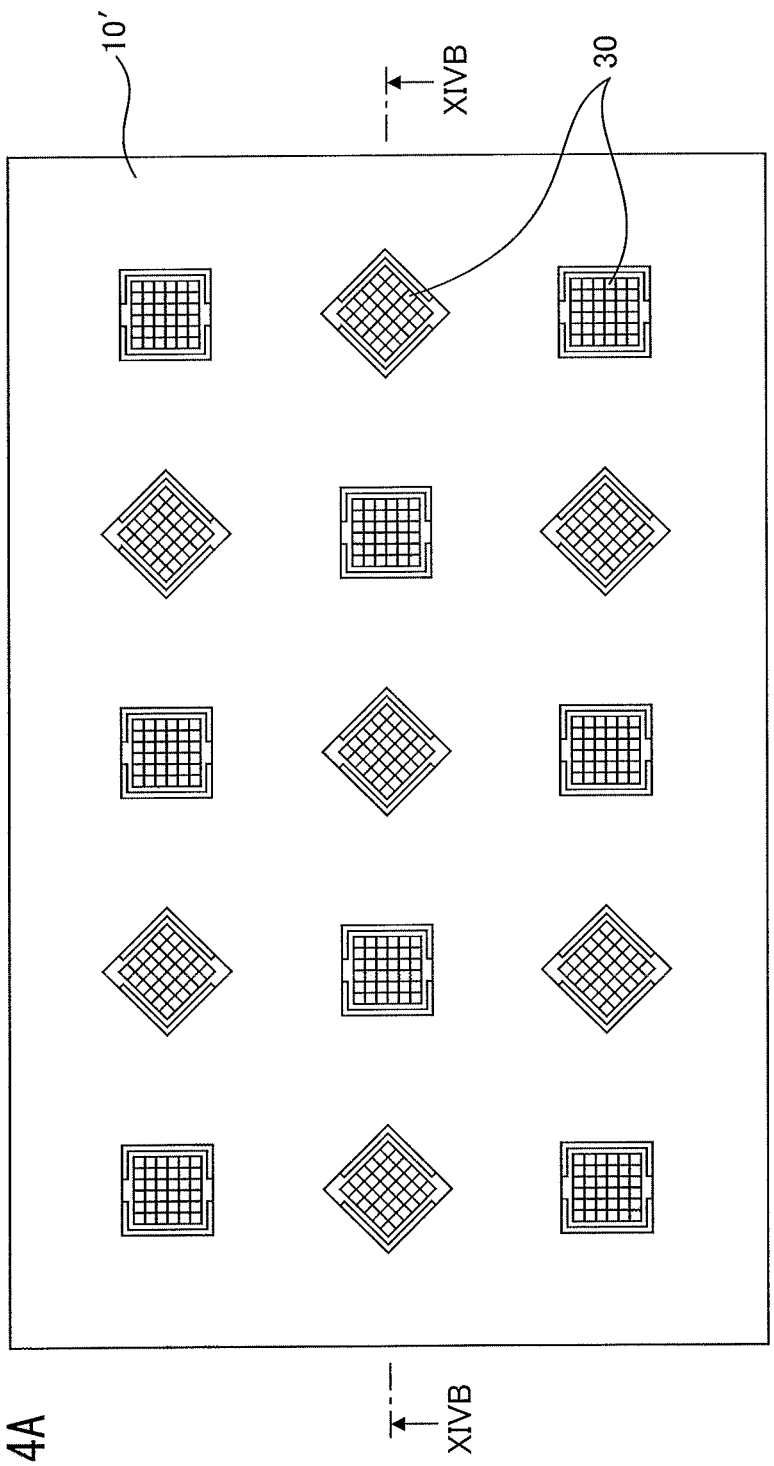
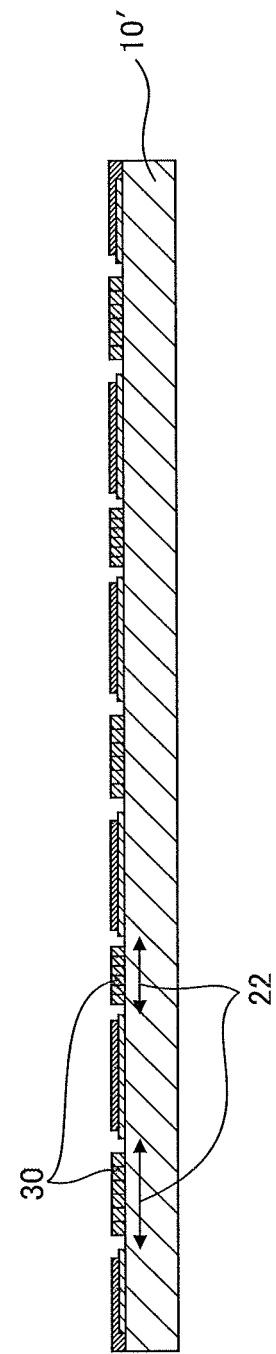

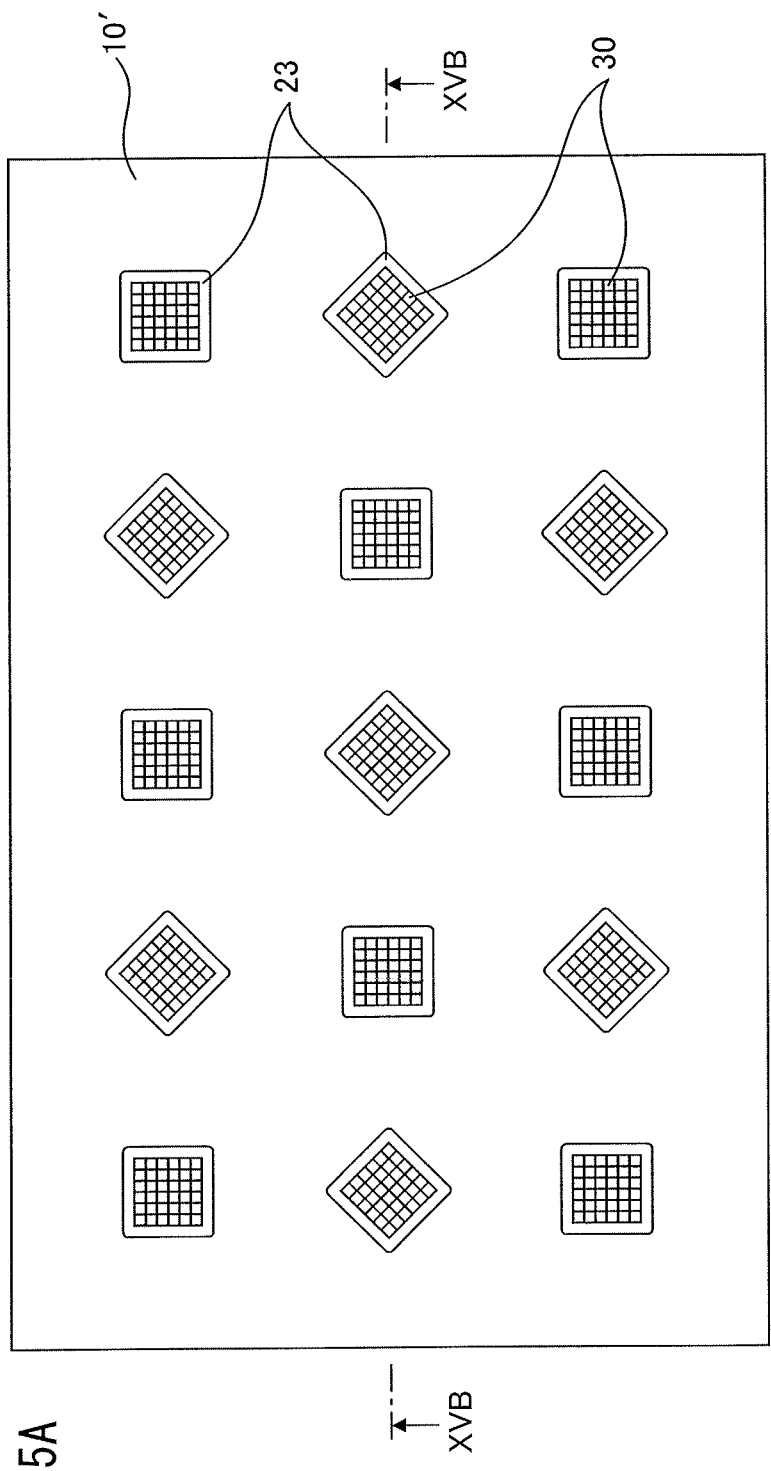
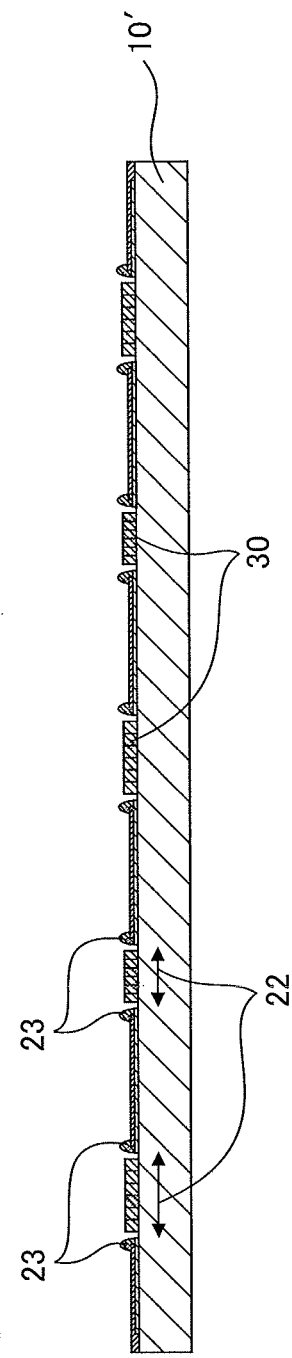
FIG. 15A
FIG. 15B

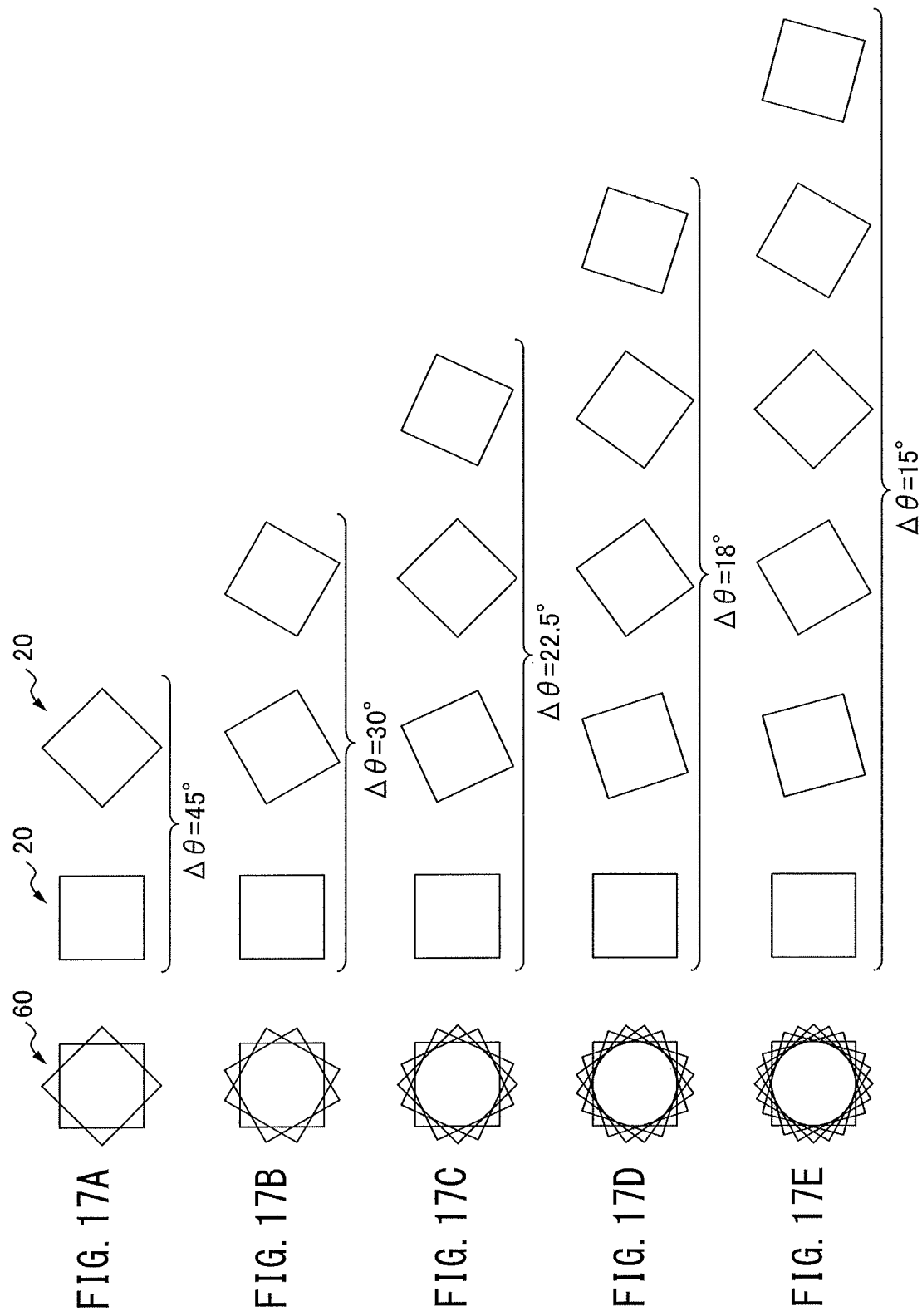

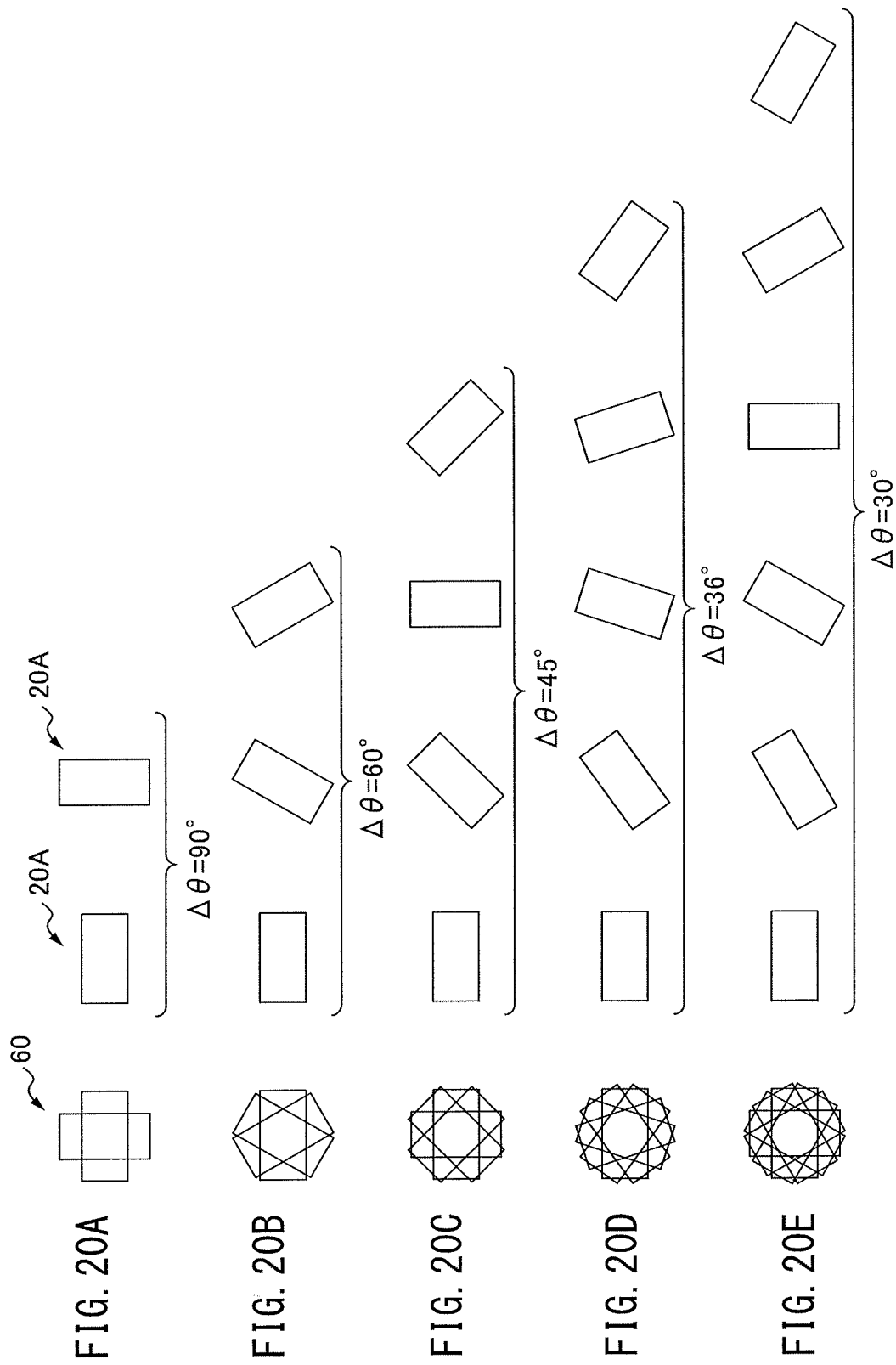

LIGHT-EMITTING APPARATUS WITH INCLINED LIGHT-EMITTING UNITS

CROSS REFERENCE TO RELATED APPLICATION

This application is a new U.S. patent application that claims benefit of JP2016-143502, filed on Jul. 21, 2016, and JP2017-135640, filed on Jul. 11, 2017. The entire contents of JP2016-143502 and JP2017-135640 are hereby incorporated by reference.

TECHNICAL FIELD

The present invention relates to a light-emitting apparatus.

BACKGROUND

A light-emitting apparatus (LED package) in which LED (light-emitting diode) elements are mounted on a substrate and the LED elements are sealed with a translucent resin containing a phosphor is known (for example, refer to Japanese Unexamined Patent Publications No. 2006-005290 and No. 2010-170945). In such a light-emitting apparatus, by mixing light from the LED elements and light obtained by exciting the phosphor by the light from the LED elements, white light or the like can be obtained depending on the intended use.

In addition, a lighting apparatus whose light quantity is increased by integrally arranging multiple LEDs is known. For example, Japanese Unexamined Patent Publication No. 2012-042670 describes an LED lighting apparatus having a plurality of LEDs, a substrate on which the LEDs are mounted, and a lens array in which a plurality of lens elements for collecting or diverging radiation light emitted from the LEDs is integrally configured.

In addition, Japanese Unexamined Patent Publication No. 2009-038302 describes a liquid crystal display apparatus in which a lighting apparatus using LED elements is used as a backlight. In particular, this publication describes an example of the case where packages on which LED elements paired for each RGB (red, green, blue) are mounted are arranged in a square lattice pattern or are zigzag arranged in a triangle lattice pattern for a liquid crystal backlight housing.

Japanese Unexamined Patent Publication No. 2008-258094 describes an LED backlight in which multichip-type full-color LEDs capable of obtaining white light by additive color mixing are arranged on a mounting plate in an array, and are mounted such that respective maximum luminance points of beams of emission light from LEDs that configure the full-color LEDs are substantially coincident on a diffuser panel provided to be opposed to the mounting plate.

Japanese Unexamined Patent Publication No. 2011-134508 describes a lighting fixture including a substrate, a multangular luminous body consisting of an LED element provided on the substrate and a phosphor provided so as to cover the LED element, a dome member that is formed from a translucent resin into a dome shape and is provided so as to cover the luminous body to diffuse light radiated from the luminous body, and a lens that performs light distribution control of the light of the luminous body radiated through the dome member. In the lighting fixture, a plurality of luminous bodies is provided on the substrate in a substantially concentric fashion, and at least one luminous body has an arrangement direction different from that of other luminous bodies.

SUMMARY

In order to obtain parallel light having high light quantity, it is desirable to manufacture a light-emitting apparatus in which a plurality of light-emitting units is formed on a common substrate and emission light from each light-emitting unit is collected by a lens corresponding to the light-emitting unit to be emitted. Generally, a lens has a circular shape, but LED elements that configure a light-emitting unit have a rectangular shape, and thus, when the LED elements are mounted in a circular mount region corresponding to the shape of the lens, excess gaps are formed, and it is difficult to increase the mounting density. In order to increase the mounting density of the LED elements so as to increase the density of light emitted from the light-emitting apparatus, it is desirable that the LED elements be densely mounted in a rectangular lattice pattern in each light-emitting unit. However, when LED elements are mounted in a rectangular lattice pattern to configure a rectangular light-emitting unit (light-emitting region) and emission light from the light-emitting unit is collected through a lens, a rectangular outline of the light is formed on a radiation surface in a reflection of the shape of the light-emitting region.

FIG. 22A and FIG. 22B are photographs illustrating a difference of an outline of light on a radiation surface due to the shape of a light-emitting region. FIG. 22A illustrates emission light from a light-emitting apparatus having a circular light-emitting unit in which LED elements are uniformly arranged in a circular mount region. FIG. 22B illustrates emission light from a light-emitting apparatus having a rectangular light-emitting unit in which LED elements are arranged in a rectangular mount region in a square lattice pattern. In the examples, either light-emitting apparatus has one light-emitting unit. An outline of light on a radiation surface is barely visible in FIG. 22A, but a rectangular outline of light is visible on a radiation surface in a reflection of the shape of the light-emitting region in FIG. 22B. Even in a light-emitting apparatus that has a plurality of light-emitting units and multiply radiates beams of emission light from the respective light-emitting units on the same radiation surface, when beams of the emission light as in FIG. 22B are directly overlapped, a rectangular outline of light (light and dark) remains.

It is an object of the present invention to, when a plurality of light-emitting units is formed on a common substrate to form one light-emitting apparatus, increase the density of light of each light-emitting unit and obscure light and dark that can be generated on a radiation surface depending on the shape of a light-emitting region of each light-emitting unit.

Provided is a light-emitting apparatus including a substrate, a plurality of light-emitting units each having a plurality of LED elements mounted on the substrate in a rectangular lattice pattern, wherein each of the light-emitting units has a rectangular light-emitting region, and a lens array including a plurality of lenses provided corresponding to the light-emitting units, respectively, the lens array being arranged on the plurality of light-emitting units, wherein the plurality of lenses is designed such that beams of emission light from the plurality of light-emitting units are collected and radiated so as to overlap with one another at a position distant from the substrate, and a part of the plurality of light-emitting units is arranged to be inclined with respect to a reference direction in a plane of the substrate by an angle different from that of other light-emitting units.

Preferably, in the above light-emitting apparatus, the LED elements are mounted in a rectangular mount region on the substrate, and are series-parallel connected to one another in each of the light-emitting units, each of the light-emitting units further has a sealing resin that is filled on the mount region to seal the plurality of LED elements, the sealing resin containing a phosphor to be excited by the plurality of LED elements, and the light-emitting region is a region covered with the sealing resin.

Preferably, in the above light-emitting apparatus, when the number of the light-emitting units is n, arrangement angles of the respective light-emitting units with respect to the reference direction are different from one another by 90°/n.

Preferably, in the above light-emitting apparatus, when light-emitting units having the same arrangement angle with respect to the reference direction among the plurality of light-emitting units are defined as one light-emitting unit group and the number of light-emitting unit groups included in the plurality of light-emitting units is m, arrangement angles of the respective light-emitting unit groups with respect to the reference direction are different from one another by 90°/m.

Preferably, in the above light-emitting apparatus, when a direction parallel with the reference direction is defined as 0° and a direction perpendicular to the reference direction in the plane of the substrate is defined as 90°, there are equal intervals between 0°, an arrangement angle of the light-emitting units arranged to be inclined with respect to the reference direction among the plurality of light-emitting units, and 90°.

Preferably, in the above light-emitting apparatus, a part of the plurality of light-emitting units is arranged along a direction of 45° with respect to the reference direction, and the rest of the plurality of light-emitting units is arranged in parallel with the reference direction.

Preferably, in the above light-emitting apparatus, the light-emitting units inclined with respect to the reference direction by 45° and the light-emitting units parallel with the reference direction are alternately arranged so as to form a checkered pattern on the substrate.

Preferably, in the above light-emitting apparatus, the plurality of light-emitting units is arranged on the substrate such that centers of the respective light-emitting units are arranged at equal intervals.

Preferably, in the above light-emitting apparatus, the light-emitting units have the same number and arrangement of the LED elements as one another, and also have the same shape and size of the light-emitting region as one another.

According to the above light-emitting apparatus, it is possible to, when a plurality of light-emitting units is formed on a common substrate to form one light-emitting apparatus, increase the density of light of each light-emitting unit and obscure light and dark that can be generated on a radiation surface depending on the shape of a light-emitting region of each light-emitting unit.

BRIEF DESCRIPTION OF THE DRAWINGS

Other features and advantages of the present invention will be apparent from the ensuing description, taken in conjunction with the accompanying drawings, in which:

FIG. 2A and FIG. 2B are a top view and a cross-sectional view of a light-emitting apparatus 2.

FIG. 3 is a top view of the lens array 40.

FIG. 4A to FIG. 4C are a top view and cross-sectional views of the light-emitting unit 20.

FIG. 8A and FIG. 8B are a top view and a cross-sectional view for describing a manufacturing process of the light-emitting apparatus 2.

FIG. 9A and FIG. 9B are a top view and a cross-sectional view for describing a manufacturing process of the light-emitting apparatus 2.

FIG. 10A and FIG. 10B are a top view and a cross-sectional view for describing a manufacturing process of the light-emitting apparatus 2.

FIG. 11A and FIG. 11B are a top view and a cross-sectional view for describing a manufacturing process of the light-emitting apparatus 2.

FIG. 14A and FIG. 14B are a top view and a cross-sectional view for describing a manufacturing process of the light-emitting apparatus 2'.

FIG. 15A and FIG. 15B are a top view and a cross-sectional view for describing a manufacturing process of the light-emitting apparatus 2'.

FIG. 17A to FIG. 17E are schematic diagrams illustrating examples of the arrangement angles of the light-emitting units.

FIG. 20A to FIG. 20E are schematic diagrams illustrating examples of the arrangement angles of the rectangular light-emitting units.

DESCRIPTION

Hereinafter, with reference to the accompanying drawings, light-emitting apparatuses will be explained in detail. However, it should be noted that the present invention is not limited to the drawings or the embodiments described below.

Figure 1A:
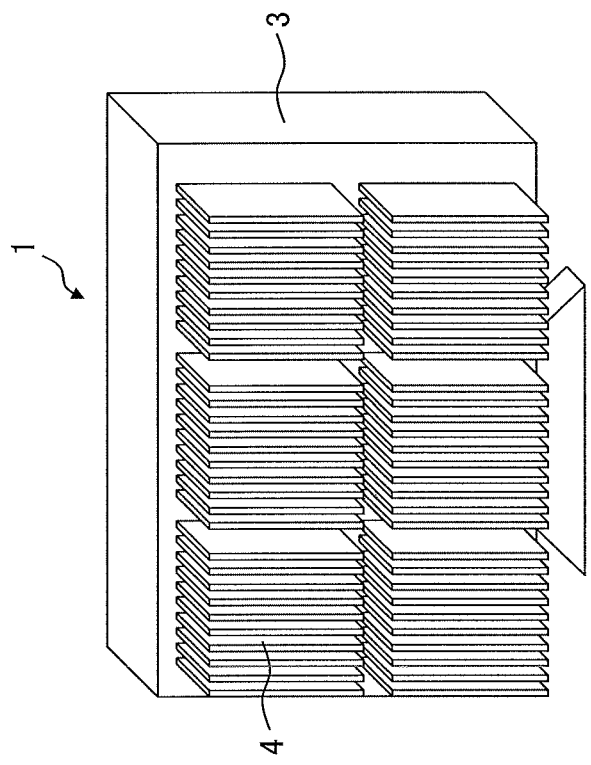
FIG. 1A and FIG. 1B are a front view and a rear view of a lighting apparatus 1.
Figure 1B:
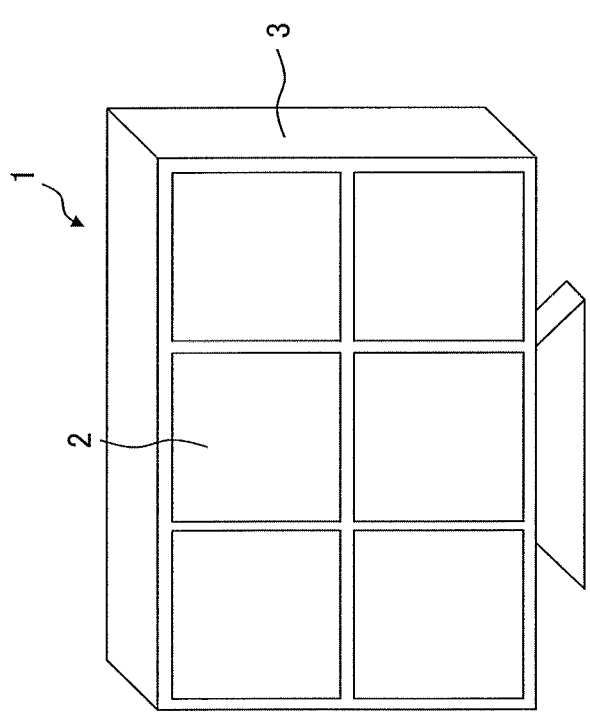

FIG. 1A and FIG. 1B are a front view and a rear view of a lighting apparatus 1. The lighting apparatus 1 is an apparatus that is usable as a flood lamp for lighting, for example, and has a total of six light-emitting apparatuses 2 arranged in two rows and three columns as illustrated in FIG. 1A, as an example. By arranging cases (housings) 3 of the respective light-emitting apparatuses 2 closely, the lighting apparatus 1 is configured as one apparatus. As the number of the light-emitting apparatuses 2 included in one lighting apparatus, there are various examples, such as two, four, and eight or more, in addition to the illustrated one. As illustrated in FIG. 1B, the lighting apparatus 1 has heat radiation fins (heatsinks) 4 for promoting release of heat generated in the light-emitting apparatuses 2, on the rear surface of the cases 3 of the respective light-emitting apparatuses 2.

FIG. 2A and FIG. 2B are a top view and a cross-sectional view of a light-emitting apparatus 2. FIG. 2B illustrates a cross section of the light-emitting apparatus 2 along the line IIB-IIB of FIG. 2A. The light-emitting apparatus 2 has a substrate 10, a plurality of light-emitting units 20 formed on the substrate 10, and a lens array 40 arranged on the plurality of light-emitting units 20. Each light-emitting apparatus 2 has a heat radiation fin 4 for radiating heat generated by the light-emitting units 20, on the rear surface side of the substrate 10, but illustration of the heat radiation fin 4 is omitted for simplification in each drawing described below.

The substrate 10 is, for example, a substantially rectangular substrate in which the length and breadth are about 10 cm, respectively, and the thickness of the substrate 10 is about 1 to 2 mm. The substrate 10 is configured by, for example, bonding a circuit substrate 12 onto a metal substrate 11 with an adhesive sheet. The end part of the substrate 10 is fixed to the case 3 of the light-emitting apparatus 2 illustrated in FIG. 1A.

The metal substrate 11 functions as a mounting substrate for mounting the light-emitting units 20 and a heat radiation substrate for radiating heat generated in the light-emitting units 20, and thus, is made of, for example, aluminum that excels in heat resistance and heat radiation. However, the material of the metal substrate 11 may other metal, such as copper, as long as it excels in heat resistance and heat radiation.

The circuit substrate 12 is an insulating substrate, such as a glass epoxy substrate, a BT resin substrate, a ceramic substrate, or a metal core substrate. In the circuit substrate 12, fifteen rectangular openings (through holes) 21 are formed, and the respective light-emitting units 20 are formed at positions of the openings 21. Although not illustrated in FIG. 2A, a conductive pattern 14 for electrically connecting the light-emitting units 20 to one another and connection electrodes for connecting the light-emitting apparatus 2 to an external power source are formed on the upper surface of the circuit substrate 12. In addition, a resist 15 (refer to FIG. 8B described below) that covers the conductive pattern 14 is formed on the upper surface of the circuit substrate 12 except outer peripheral parts of the openings 21 and a part where the connection electrodes to the external power source are placed.

The light-emitting units 20 are independent light-emitting units formed on the substrate 10, which is a common substrate, at regular intervals, and are uniformly arranged on the substrate 10. In the illustrated example, the light-emitting apparatus 2 has fifteen light-emitting units 20 arranged in a square lattice pattern. As described below, each light-emitting unit 20 has a plurality of LED elements as one element group, and the LED elements form a rectangular light-emitting region for each light-emitting unit 20. The number of the light-emitting units 20 in the light-emitting apparatus is not particularly limited, and the arrangement thereof is not necessarily the square lattice pattern. However, preferably, intervals (pitch) of the light-emitting units 20 are constant sizes so as to equalize emission light from the light-emitting apparatus 2. In other words, preferably, the respective light-emitting units 20 are arranged on the substrate 10 such that the centers (gravities) of the rectangular light-emitting regions are arranged at equal intervals. It is to be noted that the pitch of the light-emitting units 20 may differ between a vertical direction and a horizontal direction of the substrate 10.

FIG. 3 is a top view of the lens array 40. The lens array 40 is a lens assembly in which a plurality of lenses 41 is integrally formed. In the illustrated example, the lens array 40 has fifteen lenses 41 arranged closely to one another. The number of the lenses 41 is the same as the number of the light-emitting units 20 in the light-emitting apparatus 2. As illustrated in FIG. 23, an optical axis X of each lens 41 corresponds to a normal line direction of the substrate 10. The lenses 41 are provided to respectively correspond to the light-emitting units 20 in the same arrangement as the light-emitting units 20 on the substrate 10, and have the same shape and size, for example. Each lens 41 is designed such that emission light from the corresponding light-emitting unit 20 is collected and beams of emission light from the light-emitting units 20 are radiated so as to overlap with one another at a position distant from the substrate 10.

The end part of the lens array 40 is fixed to the case 3 of the light-emitting apparatus 2 illustrated in FIG. 1A. In particular, for use in a flood lamp, the light-emitting apparatus 2 is desired to be downsized as much as possible so as to make resistance from wind during use lower. Therefore, preferably, the adjacent lenses 41 are in contact with one another without intervals, and the density of the lenses 41 to the whole of the lens array 40 is increased. Since the light-emitting units 20 and the lenses 41 are in one-to-one correspondence, the pitch of the light-emitting units 20 is determined by the diameter of the lens 41.

FIG. 4A to FIG. 4C are a top view and cross-sectional views of the light-emitting unit 20. More specifically, FIG. 4A is a top view of the light-emitting unit 20, FIG. 4B is a cross-sectional view of the light-emitting unit 20 along the line IVB-IVB of FIG. 4A, and FIG. 4C is a cross-sectional view of the light-emitting unit 20 along the line IVC-IVC of FIG. 4A. All of the fifteen light-emitting units 20 in the light-emitting apparatus 2 have the same configuration, and one of them is enlarged and illustrated in FIG. 4A to FIG. 4C. The light-emitting unit 20 has a plurality of LED elements 30, a sealing frame 23, and a sealing resin 24 as main components.

The LED elements 30 are blue LEDs that emit blue light having an emission wavelength band of about 450 to 460 nm, which is made of a gallium nitride compound semiconductor or the like, for example. However, the emission wavelength band of the LED elements 30 is not particularly limited, and the LED elements 30 may be, for example, green LEDs that emit green light or red LEDs that emit red light. In addition, the emission wavelength band of the LED elements 30 may be different in each light-emitting unit 20; for example, the LED elements 30 in a certain light-emitting unit 20 are blue LEDs, and the LED elements 30 in another light-emitting unit 20 are green LEDs.

In each light-emitting unit 20, there is a substantially rectangular opening 21 in the circuit substrate 12, and the metal substrate 11 is exposed through the opening 21. The LED elements 30 are mounted on the metal substrate 11 exposed through the opening 21 such that the light-emitting surfaces face the opposite side of the metal substrate 11. The LED elements 30 are directly mounted on the metal substrate 11 in this manner, so that release of heat generated by the LED elements 30 and phosphor particles described below is promoted.

In addition, the LED elements 30 are arranged in a rectangular lattice (square lattice) pattern and are densely mounted in a rectangular mount region 22 in the opening 21. In FIG. 4A, an example of the case where four rows and four columns sixteen LED elements 30 are mounted is illustrated for simplification of illustration. The LED elements 30 are series-parallel connected to one another in each light-emitting unit 20. In the illustrated example, the LED elements 30 are arranged in groups of four series-connected elements, and the four groups thereof are further connected in parallel with one another to the conductive pattern 14 of the circuit substrate 12. It is to be noted that the mount region 22 itself may not be a strict rectangular shape and corners may be rounded as long as the outer shape of the whole of the sixteen LED elements 30 is a rectangular shape.

The number of the LED elements 30 in each light-emitting unit 20 is not particularly limited, and each light-emitting unit 20 may have more LED elements 30 so as to obtain high light quantity. In addition, the number of the LED elements 30 included in one light-emitting unit 20, and the number of series connections and the number of parallel connections of the LED elements 30 in each light-emitting unit 20 may be different in each light-emitting unit 20. However, preferably, in all of the light-emitting units 20, the number, the arrangement, and the connection relationship (the number of series connections and the number of parallel connections) of the LED elements 30 are the same as one another, and the shape and the size of the light-emitting regions are also the same as one another, so as to equalize emission light from the light-emitting apparatus 2.

The lower surfaces of the LED elements 30 are fixed to the upper surface of the metal substrate 11 with a transparent and insulating adhesive agent, for example. In addition, each LED element 30 has a pair of element electrodes on the upper surface thereof, and as illustrated in FIG. 4A and FIG. 4B, the element electrodes of the adjacent LED elements 30 are mutually and electrically connected by bonding wires 31 (hereinafter, simply referred to as wires 31). The wires 31 from the LED elements 30 positioned on the outer peripheral side of the opening 21 are electrically connected to the conductive pattern 14. Accordingly, a current is supplied to the respective LED elements 30 through the wires 31.

The sealing frame 23 is a substantially rectangular resin frame made of a white resin, for example, according to the size of the opening 21 of the circuit substrate 12, and is fixed to the outer peripheral part of the opening 21 on the upper surface of the circuit substrate 12 so as to surround the LED elements 30 in the light-emitting unit 20. The sealing frame 23 is a dam material for preventing flow of the sealing resin 24. In addition, for example, reflective coating is applied to the surface of the sealing frame 23, and thereby the sealing frame 23 reflects light emitted laterally from the LED elements 30 toward the upper side of the light-emitting unit 20 (the opposite side of the metal substrate 11 as viewed from the LED elements 30). In FIG. 4A, the sealing frame 23 is illustrated as being transparent.

The sealing resin 24 is filled in a region (the mount region 22) surrounded by the sealing frame 23 on the metal substrate 11, and thereby integrally covers and protects (seals) the whole of the LED elements 30 and the wires 31 in one light-emitting unit 20. The region covered with the sealing resin 24 is the light-emitting region of the light-emitting unit 20. Since the sealing resin 24 is formed by the substantially rectangular sealing frame 23, each light-emitting unit 20 has a substantially rectangular light-emitting region. The light-emitting region is also not limited to a strict rectangular shape, and corners may be rounded. As the sealing resin 24, for example, a colorless and transparent resin, such as an epoxy resin or a silicone resin, and, in particular, a resin having a heat resistance of about 250° C. may be used.

In addition, a phosphor that absorbs emission light from the LED elements 30 and converts the wavelength thereof is dispersedly mixed in the sealing resin 24. For example, when the LED elements 30 are blue LEDs, the sealing resin 24 may contain a yellow phosphor, such as yttrium aluminum garnet (YAG). In this case, the light-emitting unit 20 emits white light obtained by mixing blue light from the LED elements 30 that are blue LEDs, and yellow light obtained by exciting the yellow phosphor thereby. In addition, the sealing resin 24 may contain a plurality of phosphors, such as a yellow phosphor and a red phosphor, and may contain a different phosphor in each light-emitting unit 20.

The reference numeral 16 in FIG. 4A denotes inspection terminals for checking operation (lighting) of the light-emitting unit 20. The inspection terminals 16, as a group of two terminals, are provided on the upper surface of the circuit substrate 12 in each light-emitting unit 20.

Figure 5A:
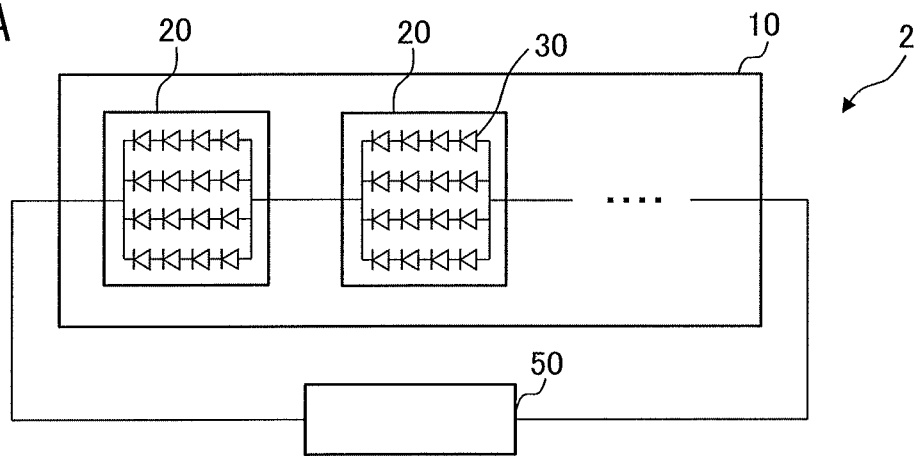
FIG. 5A and FIG. 5B are circuit diagrams of the whole of the light-emitting apparatus 2.
Figure 5B:
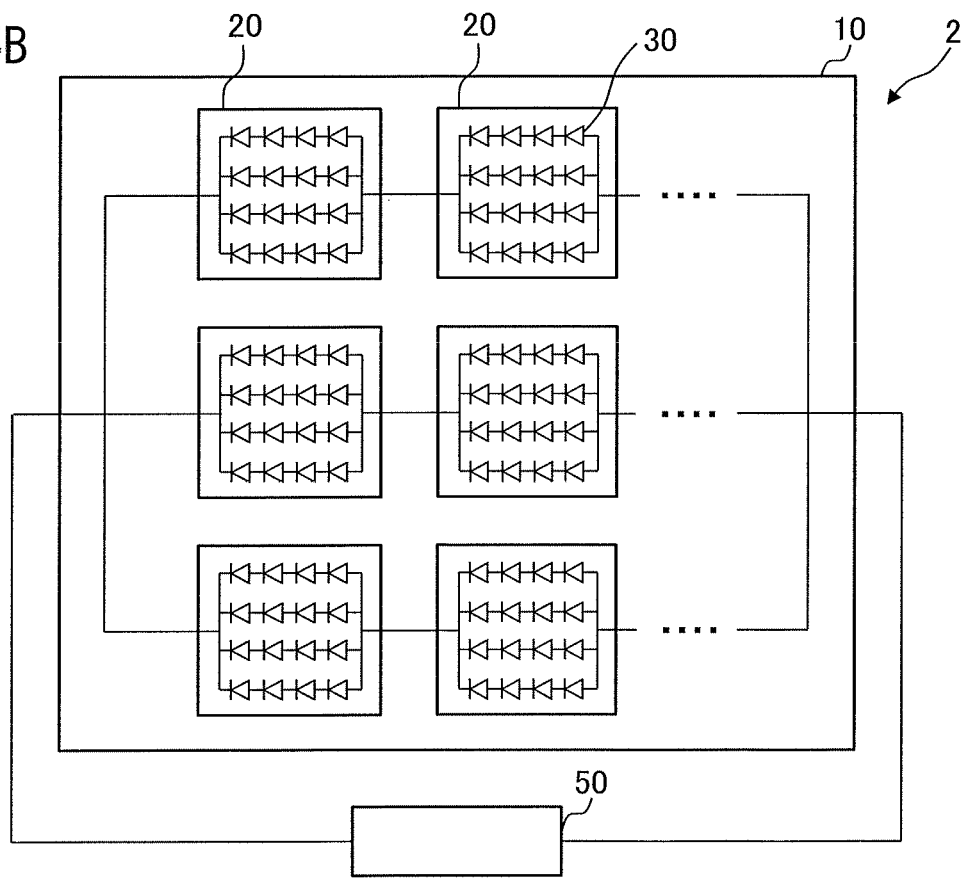

FIG. 5A and FIG. 5B are circuit diagrams of the whole of the light-emitting apparatus 2. The reference numeral 50 denotes a driver that drives the fifteen light-emitting units 20 of the light-emitting apparatus 2. The fifteen light-emitting units 20 are connected in series with the driver 50, for example, as illustrated in FIG. 5A. Alternatively, the fifteen light-emitting units 20 may be series-parallel connected to the driver 50 according to a relationship between the number of the light-emitting apparatuses 2 included in the lighting apparatus 1 and the maximum voltage that the driver 50 used can supply. The fifteen light-emitting units 20 may be divided into three groups that are connected in parallel with one another to the driver 50, and five light-emitting units 20 included in each group may be connected in series with one another, for example, as illustrated in FIG. 5B. In the light-emitting apparatus 2, all of the light-emitting units 20 may emit light at the same time, or only a part of the light-emitting units 20 may emit light according to the conductive pattern 14 of the circuit substrate 12.

Figure 6:
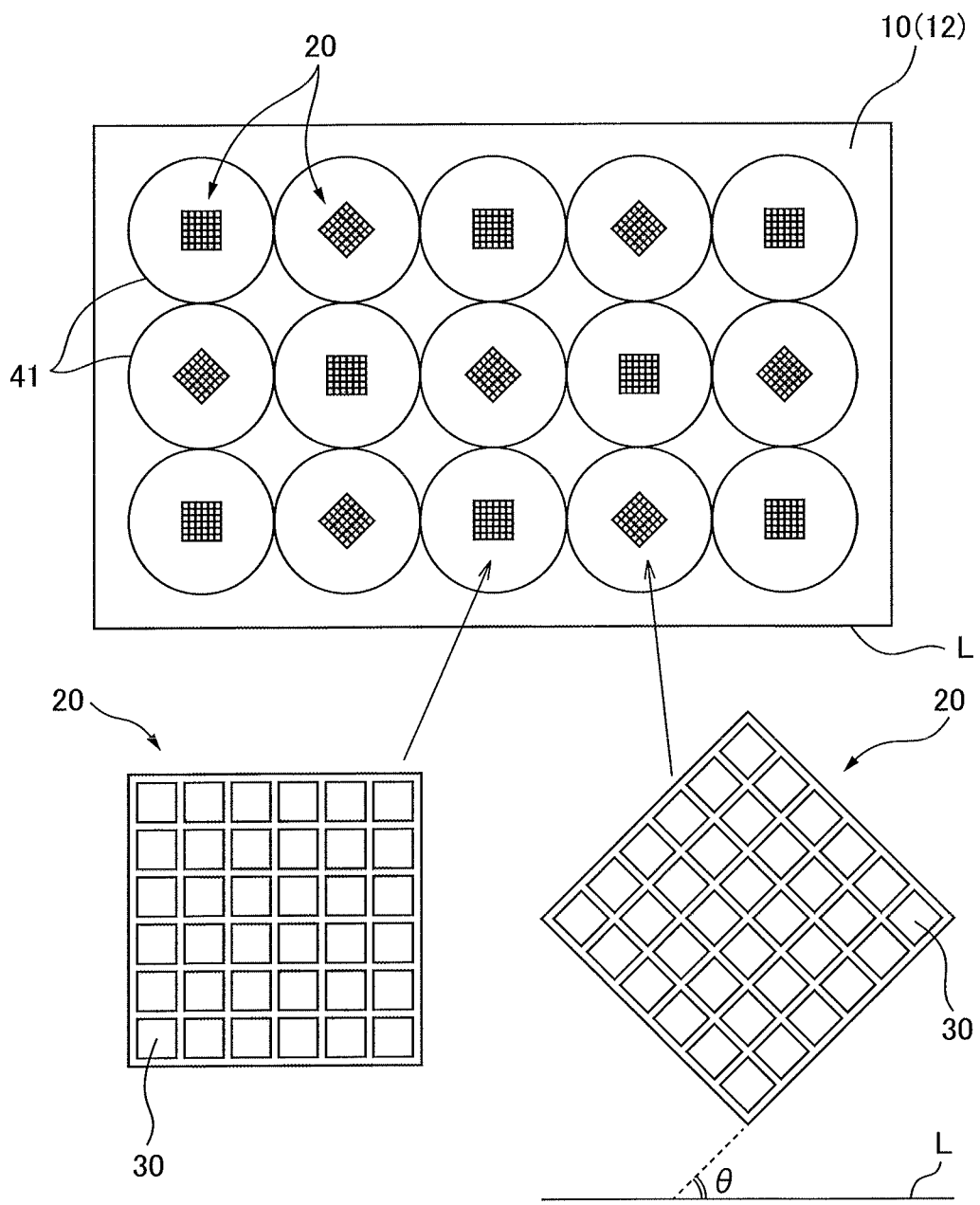
FIG. 6 is a schematic diagram illustrating the arrangement of the LED elements 30 in the light-emitting apparatus 2.

FIG. 6 is a schematic diagram illustrating the arrangement of the LED elements 30 in the light-emitting apparatus 2. In the light-emitting apparatus 2, eight light-emitting units 20 among the fifteen light-emitting units 20 are arranged in parallel with a side of the substrate 10 (the circuit substrate 12) denoted by a reference letter L, and the remaining seven light-emitting units 20 are arranged along a direction of 45° with respect to the side L.

More specifically, in the light-emitting apparatus 2, regarding eight openings 21 among the fifteen rectangular openings 21 provided in the circuit substrate 12, two sides of each opening 21 are parallel with the side L of the circuit substrate 12, and each side of the remaining seven openings 21 is along the direction of 45° with respect to the side L of the circuit substrate 12. Each light-emitting unit 20 is formed by mounting the LED elements 30 in the square lattice pattern along the sides of the opening 21, and as a result, the LED elements 30 of the eight light-emitting units 20 are arranged in parallel with the side L, and the LED elements 30 of the remaining seven light-emitting units 20 are along the direction of 45° with respect to the side L. In FIG. 6, an example of the case where each light-emitting unit 20 has six rows and six columns thirty-six LED elements 30 is illustrated.

As just described, in the light-emitting apparatus 2, the element arrangement of all of the light-emitting units 20 is the same square lattice pattern, but a part of the light-emitting units 20 is arranged to be inclined with respect to the side L of the substrate 10 by an angle different from that of other light-emitting units 20. In other words, a part of the light-emitting units 20 is arranged along a certain direction, and the rest of the light-emitting units 20 is rotated by a certain angle with respect to that direction.

When the LED elements 30 are arranged in the square lattice pattern in the square mount region 22, the same element arrangement as the original one is returned by rotating the light-emitting unit 20 by 90°, and thus, an arrangement angle θ of the light-emitting unit 20 is within a range of 0°<θ<90°. In the light-emitting apparatus 2, the light-emitting units 20 are composed of two groups, the light-emitting units 20 parallel with the side L (the arrangement angle θ is 0°) and the light-emitting units 20 inclined in a direction of a diagonal line of the substrate 10 (the arrangement angle θ is 45°). When there are two different arrangement angles of the light-emitting units 20, preferably, these values are 0° and 45°. In other words, when a direction parallel with the side L of the substrate 10 is defined as 0° and a direction perpendicular to the side L in a plane of the substrate 10 is defined as 90°, preferably, there are equal intervals between 0°, the arrangement angle θ of the light-emitting units 20 arranged to be inclined with respect to the side L, and 90°. However, in fact, the arrangement angle θ of the light-emitting units 20 inclined with respect to the side L may not be necessarily exact 45°, and may be within a range of about 45°±20°.

In the light-emitting apparatus 2, the eight light-emitting units 20 parallel with the side L and the seven light-emitting units 20 inclined with respect to the side L by 45° are alternately arranged (in other words, in a zigzag pattern, in a checkered pattern) on the substrate. As in the illustrated example, preferably, the arrangement angle θ of each light-emitting unit 20 is different from that of each adjacent light-emitting unit 20 (element group). The groups of the light-emitting units 20, in which the arrangement angles θ are different from each other, may not be necessarily alternately arranged, but, preferably, are arranged to be uniformly mixed on the circuit substrate 12.

In addition, the number of different arrangement angles of the light-emitting units 20 is not limited to two, and may be three or more. For example, there may be three arrangement angles, 0°, 30°, and 60°, or nine arrangement angles, 0°, 10°, 20°, ..., and 80°. In other words, a part of the light-emitting units 20 on the substrate 10 may be arranged in parallel with the side L of the substrate 10, and other light-emitting units 20 may be arranged to be inclined with respect to the side L by 30° and 60°, or 10°, 20°, ..., 70°, and 80°. When making a generalization, the arrangement angles $\theta_1, \ldots, \theta_n$ of the light-emitting units 20 arranged to be inclined with respect to the side L of the substrate 10 may be set to be $90-\theta_n=\theta_n-\theta_{n-1}=\ldots=\theta_1-0$. Alternatively, the arrangement angle with respect to the side L of the substrate 10 may be different in each light-emitting unit 20.

The side L of the substrate 10 illustrated in FIG. 6 is an example of a reference direction in the plane of the substrate. Since the substrate may have another shape, such as a circular shape, without limiting to a rectangular shape, the reference direction is also not limited to the direction of one side of the substrate. For example, when the substrate has a circular shape, a direction of one straight line passing through the center of the circle is selected as the reference direction, and a part of the light-emitting units 20 may be arranged to be inclined with respect to the straight line by an angle different from that of other light-emitting units 20.

Figure 7A:
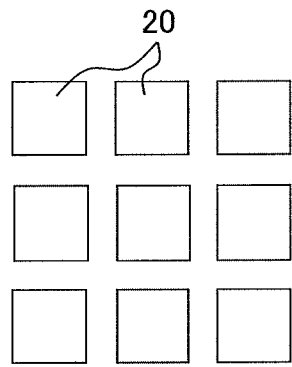
FIG. 7A to FIG. 7F are schematic diagrams for describing the arrangement of the light-emitting units 20 and overlapping of beams of emission light from the respective light-emitting units 20.
Figure 7B:
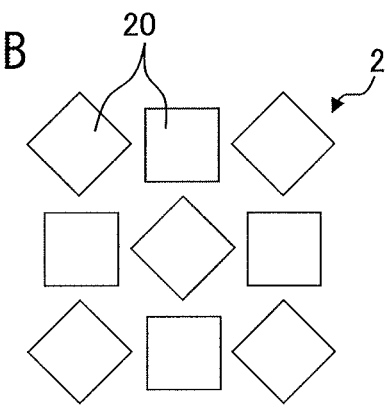
Figure 7C:
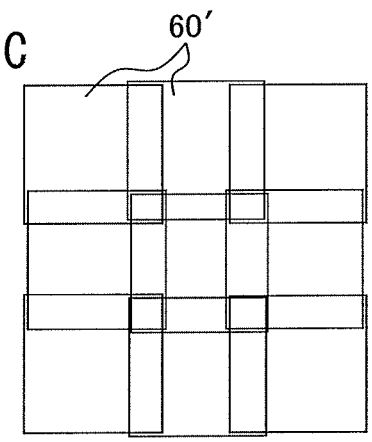
Figure 7D:
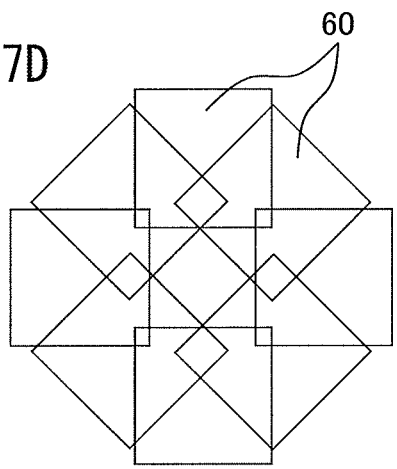
Figure 7E:
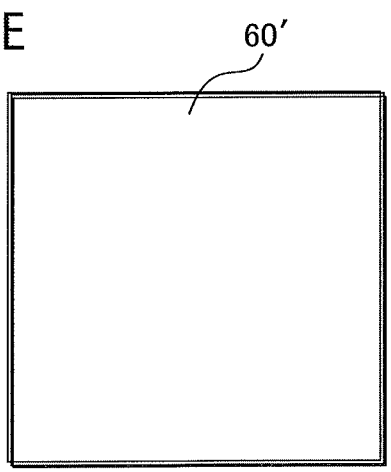
Figure 7F:
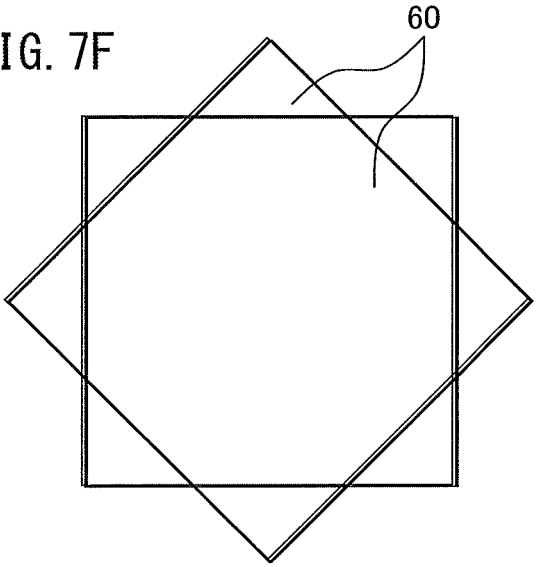

FIG. 7A to FIG. 7F are schematic diagrams for describing the arrangement of the light-emitting units 20 and overlapping of beams of emission light from the respective light-emitting units 20. More specifically, FIG. 7A illustrates a light-emitting apparatus of a comparative example, in which all of nine light-emitting units 20 are arranged at the same arrangement angle, and FIG. 7O and FIG. 7E illustrate light 60' radiated on a certain radiation surface from the light-emitting apparatus. FIG. 7B illustrates the light-emitting apparatus 2 in which four light-emitting units 20 among nine light-emitting units 20 are arranged at the arrangement angle of 0° and the remaining five light-emitting units 20 are arranged at the arrangement angle of 45°, and FIG. 7D and FIG. 7F illustrate light 60 radiated on a certain radiation surface from the light-emitting apparatus. It is assumed that the position of the radiation surface in FIG. 7E and FIG. 7F is more distant from the light-emitting apparatus than that in FIG. 7C and FIG. 7D and is sufficiently distant from the light-emitting apparatus.

Beams of light from the light-emitting units 20 are emitted parallel with one another through the lenses 41. However, a distance between the radiation surface on which light from the light-emitting apparatus 2 is to be radiated and the light-emitting units 20 is much larger than a distance between the light-emitting units 20, and thus, in fact, the beams of light of the respective light-emitting units 20 are radiated so as to overlap with one another, as illustrated in FIG. 7C to FIG. 7F. In the light-emitting apparatus of the comparative example, since all of the light-emitting units 20 are arranged at the same arrangement angle, in a reflection of the rectangular shape of the light-emitting regions, the outer shape of the whole of beams of the radiation light 60' on the sufficiently-distant radiation surface also has a rectangular shape, as illustrated in FIG. 7E.

In contrast, in the light-emitting apparatus 2, since the light-emitting units 20 have two different arrangement angles, 0° and 45°, even if each light-emitting region has a rectangular shape, rectangular beams of the radiation light 60 which are inclined to one another by 45° are overlapped, so that the outer shape of the whole of the beams of the radiation light 60 on the radiation surface is a substantially octagon shape, as illustrated in FIG. 7D and FIG. 7F. In other words, even if the light-emitting region of each light-emitting unit 20 has a rectangular shape, when the arrangement angles of the light-emitting units 20 are different from one another, an image obtained by overlapping the beams of emission light thereof at a sufficient distance from the light-emitting apparatus approximates to a circular shape. By setting a difference between the arrangement angles of the respective light-emitting units 20 to be smaller than 45°, the outer shape of the image obtained by overlapping the beams of emission light from the respective light-emitting units 20 further approximates to a circular shape compared to the octagon shape. Conversely, a relationship of the arrangement angles of two light-emitting units 20 is set such that overlapping of images of beams of emission light from these light-emitting units 20 more approximates to a circular shape compared to an image of emission light from only one light-emitting unit 20.

Figure 22B:
FIG. 22A and FIG. 22B are photographs illustrating a difference of an outline of light on a radiation surface due to the shape of a light-emitting region.
Figure 22A:
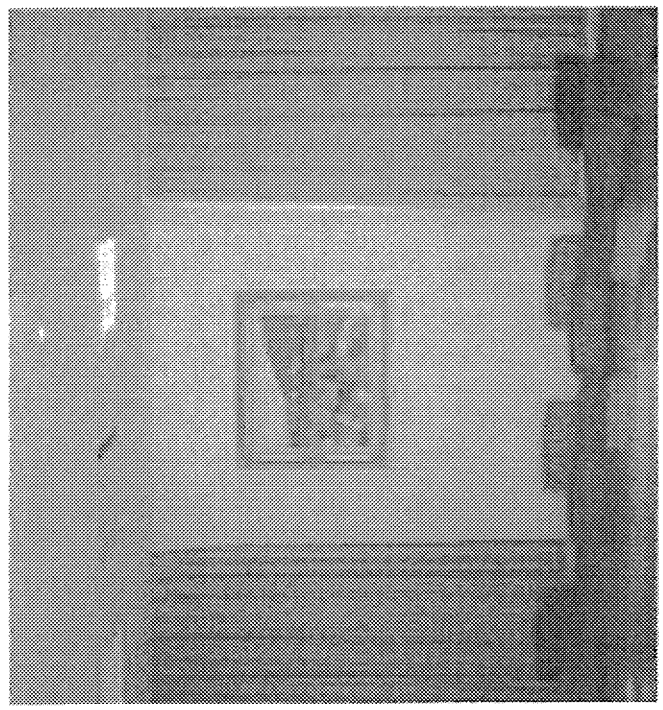

In the light-emitting apparatus 2, in each light-emitting unit 20, the LED elements 30 are densely mounted in the square lattice pattern in the rectangular mount region 22, and thus, the density of light from each light-emitting unit 20 is increased. Furthermore, since a part of the light-emitting units 20 is arranged to be inclined with respect to the side of the substrate 10 by an angle different from that of other light-emitting units 20, even if the light-emitting region of each light-emitting unit 20 has a rectangular shape, the image obtained by overlapping the beams of emission light from the respective light-emitting units 20 approximates to a circular shape, as illustrated in FIG. 7F. Therefore, in the light-emitting apparatus 2, a rectangular outline of light and dark on the radiation surface as described using FIG. 22B does not easily appear.

FIG. 8A to FIG. 11B are top views and cross-sectional views for describing a manufacturing process of the light-emitting apparatus 2. FIG. 8B, FIG. 9B, FIG. 10B, and FIG. 11B illustrate cross-sections along the line VIIIB-VIIIB of FIG. 8A, the line IXB-IXB of FIG. 9A, the line XB-XB of FIG. 10A, and the line XIB-XIB of FIG. 11A, respectively.

At the time of manufacture of the light-emitting apparatus 2, first, as illustrated in FIG. 8A and FIG. 8B, the metal substrate 11 and the circuit substrate 12 having the openings 21 are overlapped with and attached to each other. Then, as described below, the light-emitting units 20 are formed at one time on the substrate 10.

On this occasion, as illustrated in FIG. 9A and FIG. 9B, on the upper surface of the metal substrate 11 exposed in each opening 21 (the mount region 22), the LED elements 30 are arranged and mounted in the square lattice pattern such that the light-emitting surfaces face the opposite side of the metal substrate 11. At this time, adjacent LED elements 30 are connected to one another with the wires 31, and the wires 31 from the LED elements 30 on the outer peripheral side of each mount region 22 are electrically connected to the conductive pattern 14. In addition, as illustrated in FIG. 10A and FIG. 10B, the sealing frame 23 is fixed to the outer peripheral part of each opening 21 on the upper surface of the circuit substrate 12. Then, as illustrated in FIG. 11A and FIG. 11B, in each opening 21, the sealing resin 24 containing a phosphor is filled in a region surrounded by the sealing frame 23 on the metal substrate 11, so that the LED elements 30 are sealed.

Subsequently, as illustrated in FIG. 2A and FIG. 2B, the lens array 40 including the lenses 41 is arranged on the circuit substrate 12 such that positions of the respective light-emitting units 20 relatively conform to positions of the lenses 41 corresponding thereto. According to the above processes, the light-emitting apparatus 2 illustrated in FIG. 2A and FIG. 2B is completed.

Figure 12A:
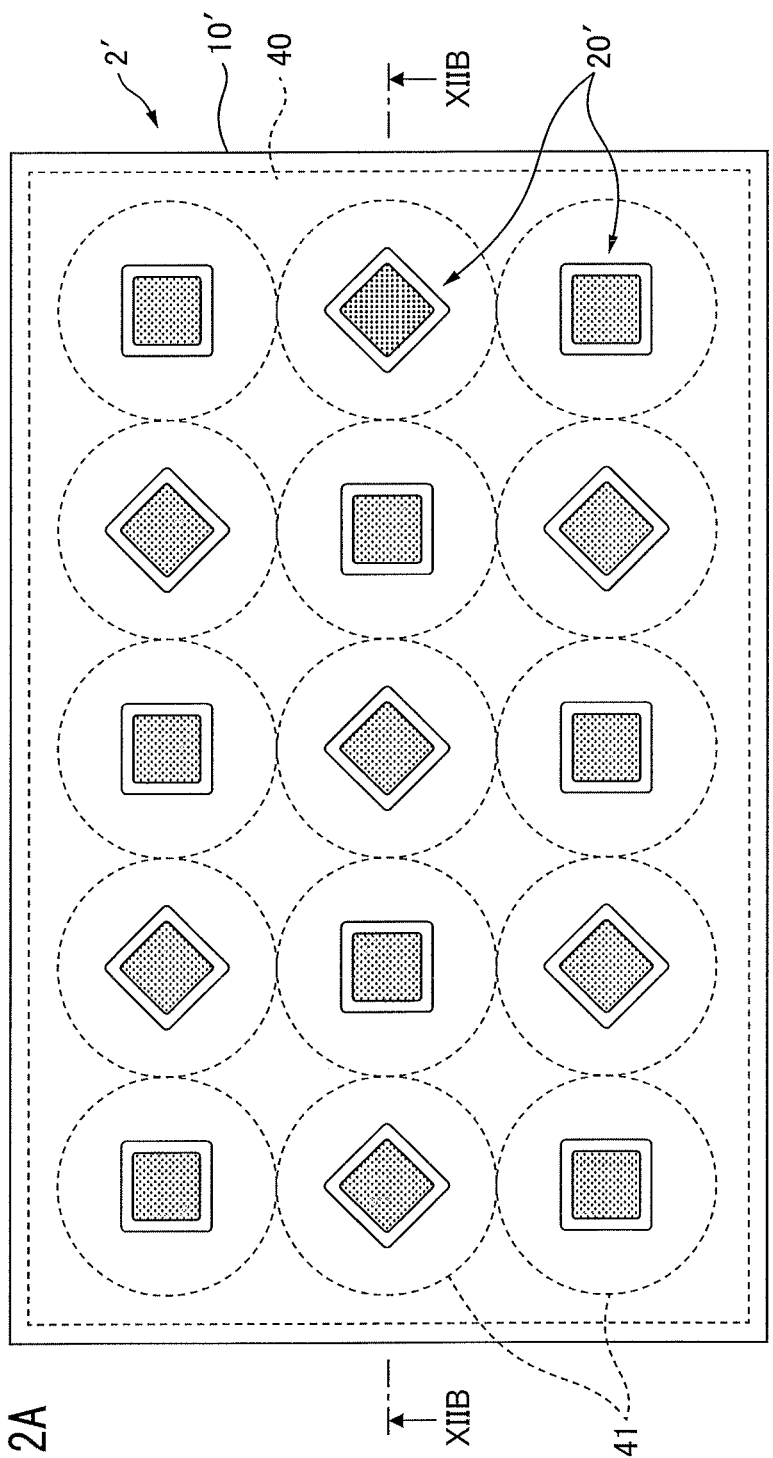
FIG. 12A and FIG. 12B are a top view and a cross-sectional view of another light-emitting apparatus 2'.
Figure 12B:
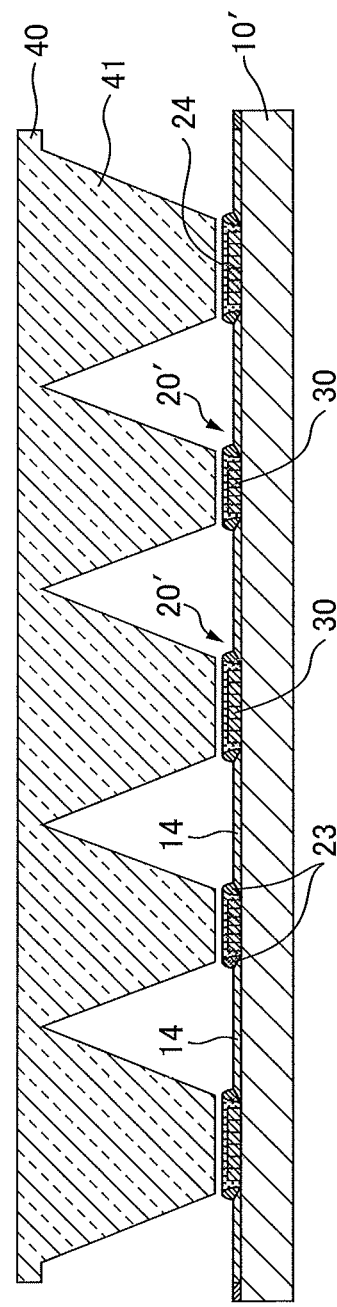

FIG. 12A and FIG. 12B are a top view and a cross-sectional view of another light-emitting apparatus 2'. FIG. 12B illustrates a cross section of the light-emitting apparatus 2' along the line XIIB-XIIB of FIG. 12A. The light-emitting apparatus 2' is different from the light-emitting apparatus 2 in that there is not the circuit substrate 12 having the openings 21, which is included in the light-emitting apparatus 2, but has the same configurations as those of the light-emitting apparatus 2 in other respects. Therefore, regarding the light-emitting apparatus 2', parts different from those of the light-emitting apparatus 2 will be mainly described, and the description of parts in common with those of the light-emitting apparatus 2 will be omitted below.

Figure 13A:
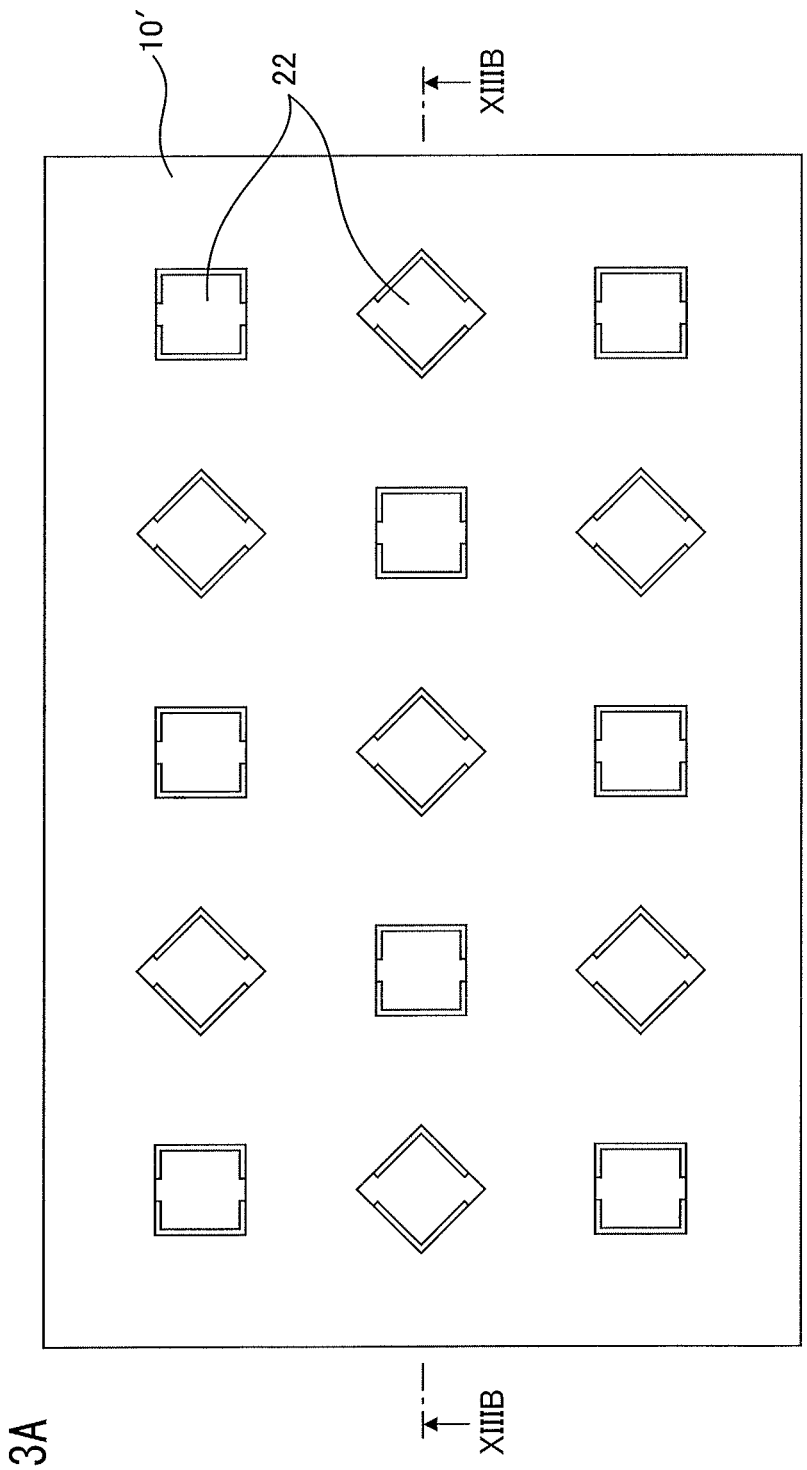
FIG. 13A and FIG. 13B are a top view and a cross-sectional view of a substrate 10' of the light-emitting apparatus 2'.
Figure 13B:
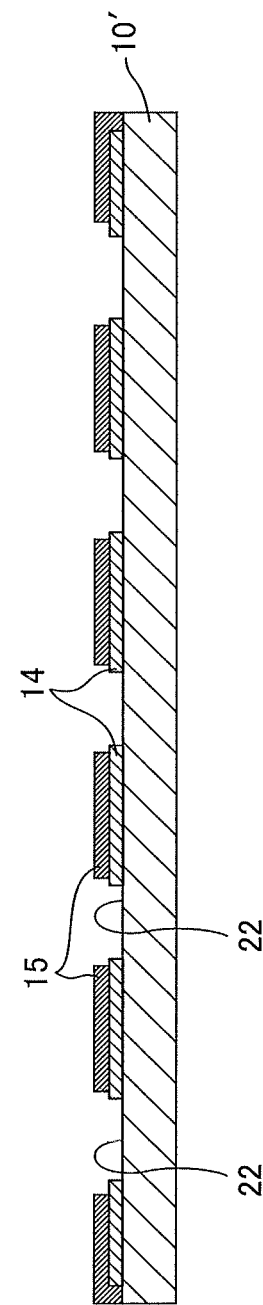

FIG. 13A and FIG. 13B are a top view and a cross-sectional view of a substrate 10' of the light-emitting apparatus 2'. FIG. 13B illustrates a cross section of the substrate 10' along the line XIIIB-XIIIB of FIG. 13A. The substrate 10' of the light-emitting apparatus 2' is an insulating substrate made of ceramic, for example, and has the mount regions 22 of the LED elements 30 which are to be light-emitting units 20', respectively, on the upper surface thereof at fifteen sites arranged in the square lattice pattern. The conductive pattern 14 for electrically connecting the light-emitting units 20' to one another and the connection electrodes for connecting the light-emitting apparatus 2' to an external power source are formed on the upper surface of the substrate 10'. In addition, the resist 15 that covers the conductive pattern 14 is formed on the upper surface of the substrate 10' except the mount regions 22 and a part where the connection electrodes to the external power source are placed.

As illustrated in FIG. 12A, the light-emitting apparatus 2' has fifteen light-emitting units 20' independent of one another, as with the light-emitting apparatus 2. Also in the light-emitting apparatus 2', a part of the light-emitting units 20' is arranged to be inclined with respect to a side of the substrate 10' by an angle different from that of other light-emitting units 20'. Beams of emission light from the light-emitting units 20' are collected by the lenses 41 respectively corresponding to the light-emitting units 20', and are radiated so as to overlap with one another at a position distant from the substrate 10'.

Each light-emitting unit 20' has the plurality of LED elements 30, the sealing frame 23, and the sealing resin 24, as with the light-emitting units 20 of the light-emitting apparatus 2. In each light-emitting unit 20', the LED elements 30 are densely mounted in the square lattice pattern on the upper surface of the substrate 10', and forms one element group. In each light-emitting unit 20', the LED elements 30 are series-parallel connected to one another with the bonding wires. In the light-emitting apparatus 2', since the LED elements 30 are mounted on the insulating substrate, flip-chip mounting can also be performed by using bump-type elements as the LED elements 30.

Also in the light-emitting apparatus 2', in each light-emitting unit 20', the LED elements 30 are densely mounted in the square lattice pattern in the rectangular mount region 22, and thus, the density of light from each light-emitting unit 20' is increased. In addition, also in the light-emitting apparatus 2', since a part of the light-emitting units 20' is arranged to be inclined with respect to the side of the substrate 10' by an angle different from that of other light-emitting units 20', an image obtained by overlapping the beams of emission light from the respective light-emitting units 20' approximates to a circular shape, and a rectangular outline of light and dark on the radiation surface does not easily appear.

Figure 16A:
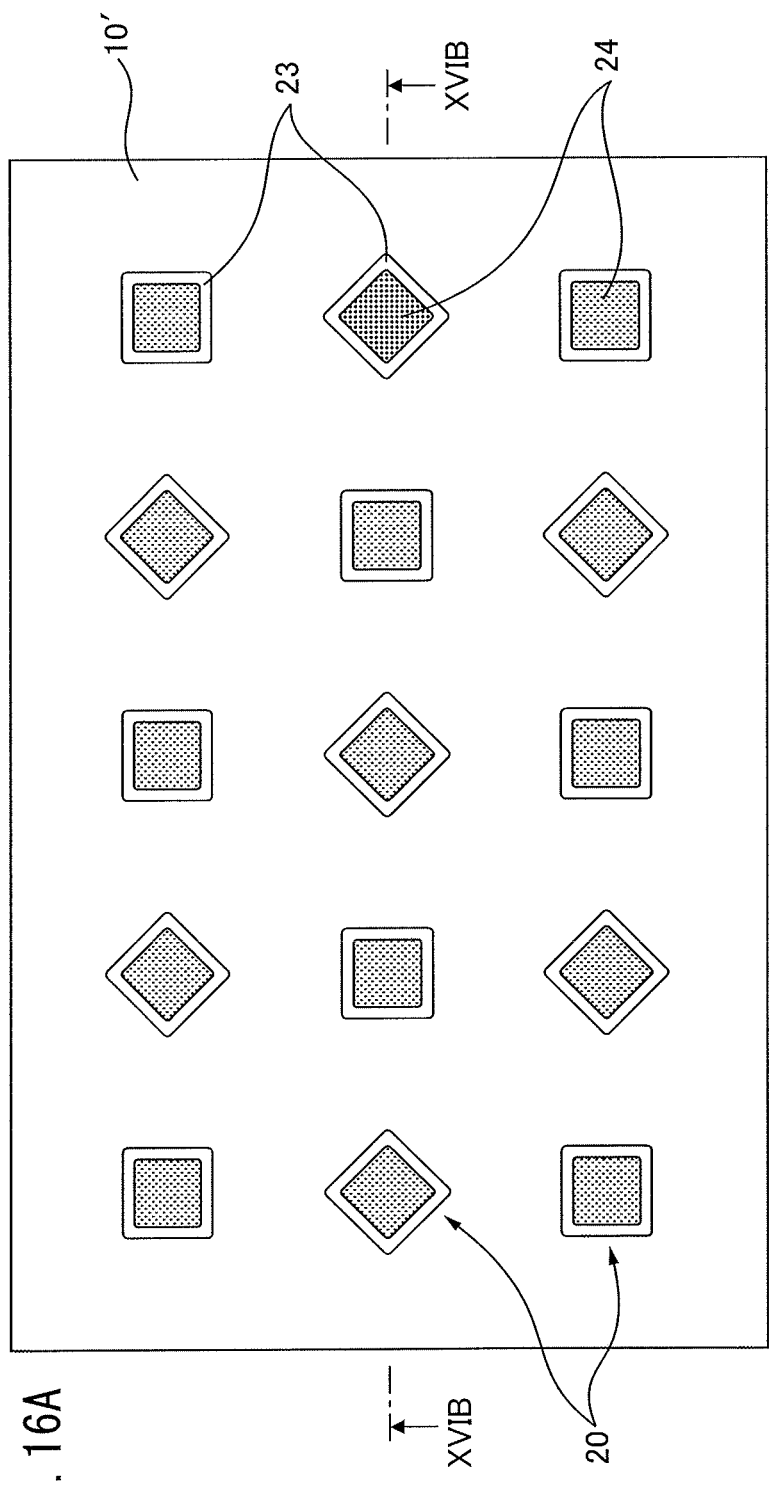
FIG. 16A and FIG. 16B are a top view and a cross-sectional view for describing a manufacturing process of the light-emitting apparatus 2'.
Figure 16B:
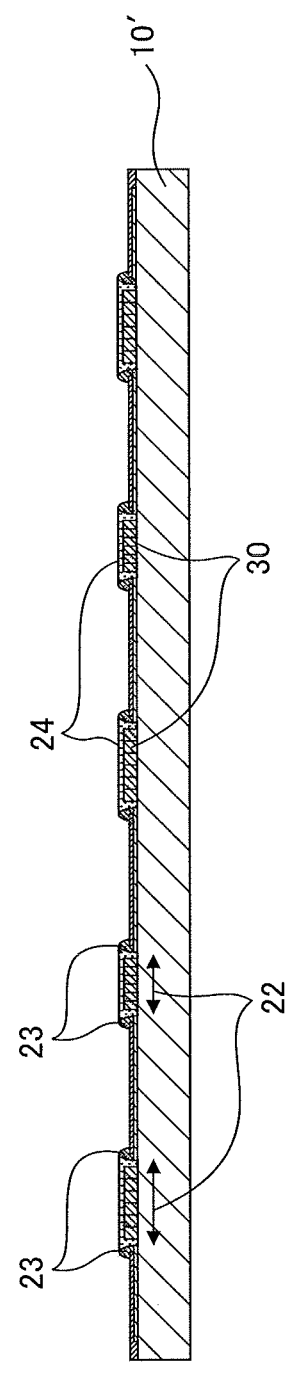

FIG. 14A to FIG. 16B are top views and cross-sectional views for describing a manufacturing process of the light-emitting apparatus 2'. FIG. 14B, FIG. 15B, and FIG. 16B illustrate cross-sections along the line XIVB-XIVB of FIG. 14A, the line XVB-XVB of FIG. 15A, and the line XVIB-XVIB of FIG. 16A, respectively.

At the time of manufacture of the light-emitting apparatus 2', as illustrated in FIG. 14A and FIG. 14B, the LED elements 30 are arranged and mounted in the square lattice pattern in each mount region 22 on the substrate 10' illustrated in FIG. 13A and FIG. 13B. At this time, adjacent LED elements 30 are connected to one another with the bonding wires, and the bonding wires from the LED elements 30 on the outer peripheral side of each mount region 22 are electrically connected to the conductive pattern 14. In addition, as illustrated in FIG. 15A and FIG. 15B, the sealing frame 23 is fixed to the outer peripheral part of each mount region 22 on the upper surface of the substrate 10'. Then, as illustrated in FIG. 16A and FIG. 16B, in each mount region 22, the sealing resin 24 containing a phosphor is filled in a region surrounded by the sealing frame 23, so that the LED elements 30 are sealed. Accordingly, the light-emitting units 20' are formed on the substrate 10'.

Subsequently, as illustrated in FIG. 12A and FIG. 12B, the lens array 40 including the lenses 41 is arranged on the substrate 10' such that positions of the respective light-emitting units 20' relatively conform to positions of the lenses 41 corresponding thereto. According to the above processes, the light-emitting apparatus 2' illustrated in FIG. 12A and FIG. 12B is completed.

FIG. 17A to FIG. 17E are schematic diagrams illustrating examples of the arrangement angles of the light-emitting units. In each drawing, the light-emitting units 20 are illustrated on the right side, and the radiation light 60 onto a sufficiently-distant radiation surface by a light-emitting apparatus including the light-emitting units 20 is illustrated on the left side. FIG. 17A illustrates the case where the difference $\Delta\theta$ between the arrangement angles of the light-emitting units 20 is 45°, and the light-emitting units 20 having two arrangement angles with respect to a reference direction in the plane of the substrate (for example, one side of the substrate) of 0° and 45° are included. The light-emitting apparatus in this case corresponds to the above-described light-emitting apparatus 2, and the radiation light 60 of FIG. 17A is the same as that illustrated in FIG. 7F.

FIG. 17B to FIG. 17E illustrate examples of the case where there are three or more different arrangement angles of the light-emitting units 20 included in one light-emitting apparatus. FIG. 17B illustrates the case where there are three arrangement angles of the light-emitting units 20, 0°, 30°, and 60° ($\Delta\theta$ is 30°). Similarly, FIG. 17C illustrates the case where there are four arrangement angles, 0°, 22.5°, 45°, and 67.5° ($\Delta\theta$ is 22.5°). FIG. 17D illustrates the case where there are five arrangement angles, 0°, 18°, 36°, 54°, and 72° ($\Delta\theta$ is 18°). FIG. 17E illustrates the case where there are six arrangement angles, 0°, 15°, 30°, 45°, 60°, and 75° ($\Delta\theta$ is 15°).

As can be seen from these examples, as $\Delta\theta$ is smaller and the number of mutually-different arrangement angles of the light-emitting units 20 in one light-emitting apparatus is larger, an image obtained by overlapping beams of the radiation light 60 from the respective light-emitting units 20 with one another at a sufficient distance from the light-emitting apparatus more approximates to a circular shape. Therefore, in order to prevent a rectangular outline of light and dark on the radiation surface from being formed, preferably, the number of mutually-different arrangement angles of the light-emitting units 20 is increased as much as possible by variously changing the arrangement angles of the light-emitting units 20 included in one light-emitting apparatus.

Figure 18A:
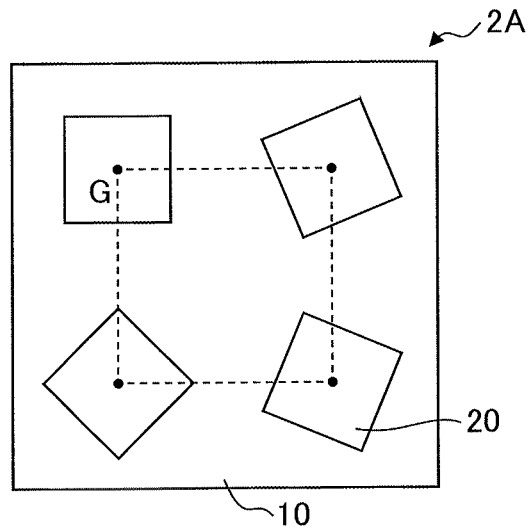
FIG. 18A to FIG. 18C are top views illustrating arrangement examples of the light-emitting units on the substrate.
Figure 18B:
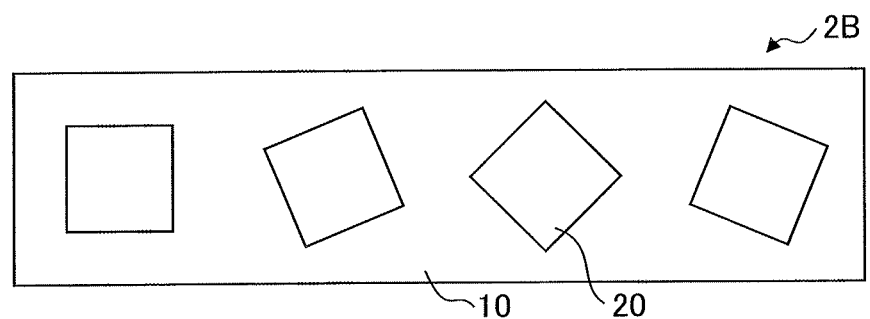
Figure 18C:
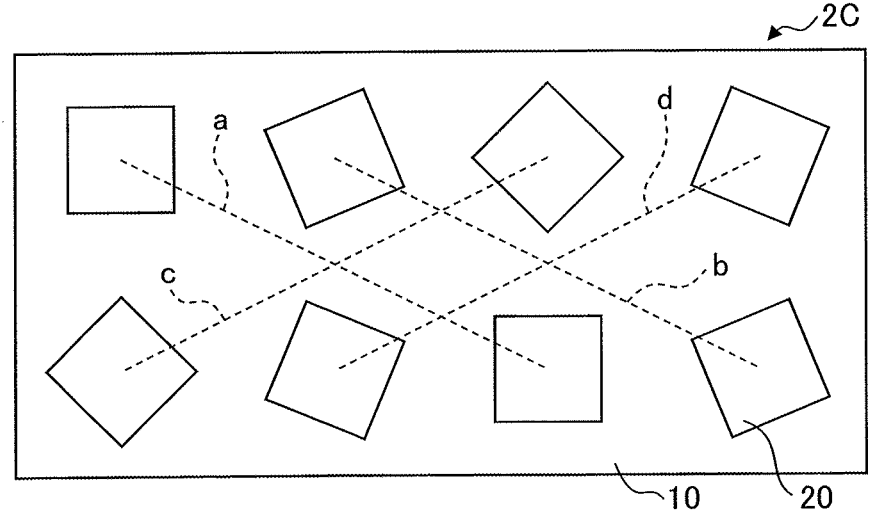

FIG. 18A to FIG. 18C are top views illustrating arrangement examples of the light-emitting units on the substrate. In these drawings, light-emitting apparatuses 2A to 2C including four types of the light-emitting units 20 illustrated in FIG. 17C in which the difference $\Delta\theta$ between the arrangement angles is 22.5° are illustrated. In the light-emitting apparatus 2A of FIG. 18A, four light-emitting units 20 whose arrangement angles with respect to the side of the substrate 10 are different from one another are arranged in two rows and two columns on the substrate 10. In the light-emitting apparatus 2B of FIG. 18B, the same four light-emitting units 20 are arranged laterally in a row on the substrate 10, and in the light-emitting apparatus 2C of FIG. 18C, a total of eight light-emitting units 20, in which pairs of light-emitting units 20 respectively have the same arrangement angles, are arranged in two rows and four columns in a lattice pattern. In the light-emitting apparatus 2A, the light-emitting units 20 are arranged at equal intervals such that the centers (gravities) G of the respective light-emitting regions are located on four corners of a square indicated by the dotted line in the drawing, and this is the same as in the light-emitting apparatuses 2B, 2C.

As in the light-emitting apparatuses 2A, 2B, when the number of the light-emitting units 20 is n, preferably, the arrangement angles of the respective light-emitting units 20 with respect to the reference direction, such as the side of the substrate 10, are different from one another by 90°/n. Alternatively, as in the light-emitting apparatus 2C, a plurality of light-emitting units 20 having the same arrangement angle may be included in one light-emitting apparatus. In this case, when the light-emitting units 20 having the same arrangement angle with respect to the reference direction among the light-emitting units 20 in the light-emitting apparatus are defined as one light-emitting unit group and the number of the light-emitting unit groups in the light-emitting apparatus is m, preferably, the arrangement angles of the respective light-emitting unit groups with respect to the reference direction are different from one another by 90°/m. In the illustrated example, since there are four groups indicated by the dashed lines a to d in FIG. 18C as the light-emitting unit groups, the number thereof is four.

Figure 19A:
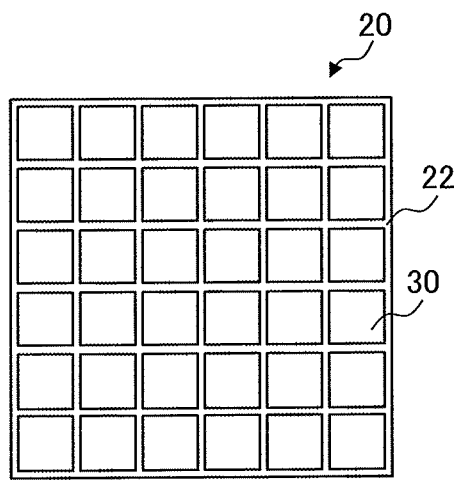
FIG. 19A to FIG. 19D are top views illustrating modified examples of the light-emitting unit.
Figure 19B:
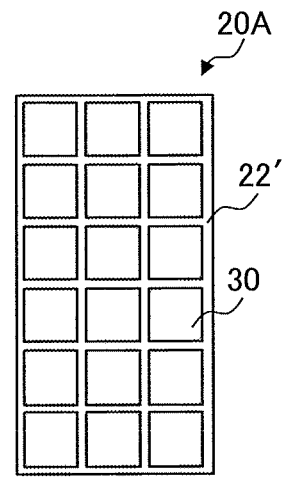
Figure 19C:
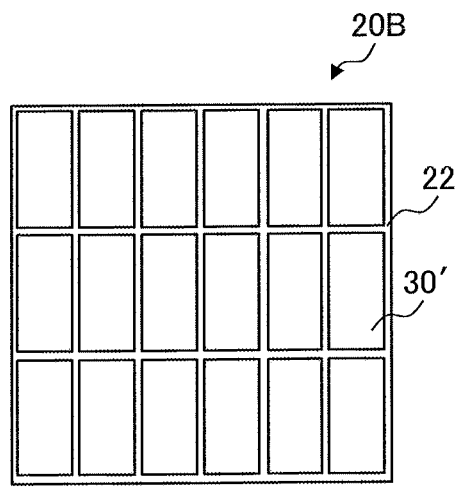
Figure 19D:
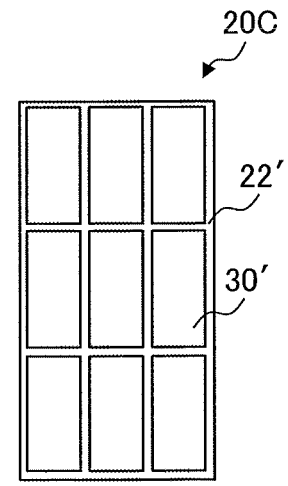

FIG. 19A to FIG. 19D are top views illustrating modified examples of the light-emitting unit. In these drawings, only the mount region and the LED elements are illustrated as the light-emitting unit for simplification. The light-emitting unit 20 illustrated in FIG. 19A is a light-emitting unit in which thirty-six LED elements 30 having a square shape when viewed from the top are arranged in six rows and six columns in a lattice pattern in the square mount region 22, and is the same as that illustrated in FIG. 6. A light-emitting unit 20A illustrated in FIG. 19B is a light-emitting unit in which eighteen LED elements 30 having a square shape when viewed from the top are arranged in six rows and three columns in a lattice pattern in a rectangular mount region 22'. A light-emitting unit 20B illustrated in FIG. 19C is a light-emitting unit in which eighteen LED elements 30' having a rectangular shape when viewed from the top are arranged in three rows and six columns in a lattice pattern in the square mount region 22. A light-emitting unit 20C illustrated in FIG. 19D is a light-emitting unit in which nine LED elements 30' having a rectangular shape when viewed from the top are arranged in three rows and three columns in a lattice pattern in the rectangular mount region 22'.

Although all of the light-emitting units that have been described above have the square mount region (light-emitting region), the LED elements can be densely mounted in the lattice pattern in the same manner even when the mount region has a rectangular shape. Therefore, as in the light-emitting units 20A, 20C, the mount region (light-emitting region) of the light-emitting unit may have a rectangular shape without limiting to a square shape. In addition, as in the light-emitting units 20B, 20C, the LED elements that configure the light-emitting unit may have a rectangular shape when viewed from the top, and also when the rectangular LED elements are used, the LED elements may be densely mounted in the lattice pattern so as to configure a square or rectangular light-emitting region.

FIG. 20A to FIG. 20E are schematic diagrams illustrating examples of the arrangement angles of the rectangular light-emitting units. In each drawing, as in FIG. 17A to FIG. 17E, the light-emitting units 20A are illustrated on the right side, and the radiation light 60 onto a sufficiently-distant radiation surface by a light-emitting apparatus including the light-emitting units 20A is illustrated on the left side. FIG. 20A illustrates the case where there are two arrangement angles of the light-emitting units 20A with respect to the reference direction in the plane of the substrate, 0° and 90° (Δθ is 90°). Similarly, FIG. 20B illustrates the case where there are three arrangement angles, 0°, 60°, and 120° (Δθ is 60°). FIG. 20C illustrates the case where there are four arrangement angles, 0°, 45°, 90°, and 135° (Δθ is 45°). FIG. 20D illustrates the case where there are five arrangement angles, 0°, 36°, 72°, 108°, and 144° (Δθ is 36°). FIG. 20E illustrates the case where there are six arrangement angles, 0°, 30°, 60°, 90°, 120°, and 150° (Δθ is 30°).

Figure 21A:
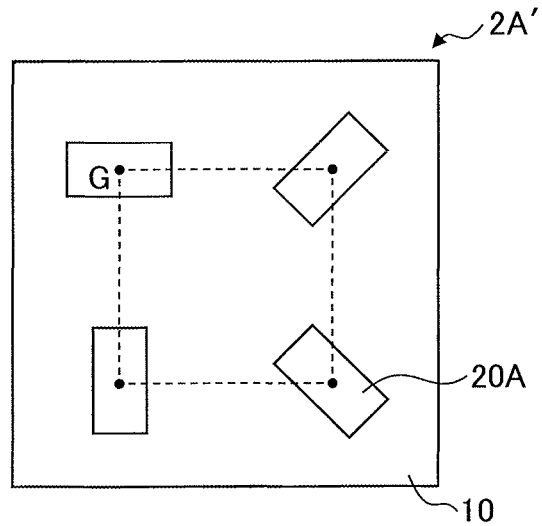
FIG. 21A to FIG. 21C are top views illustrating arrangement examples of the rectangular light-emitting units on the substrate.
Figure 21B:
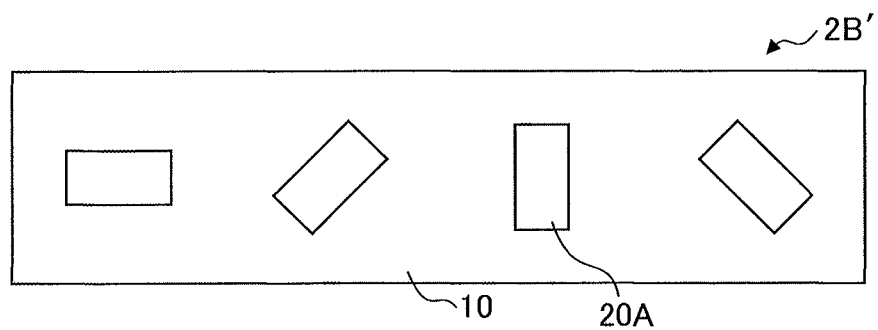
Figure 21C:
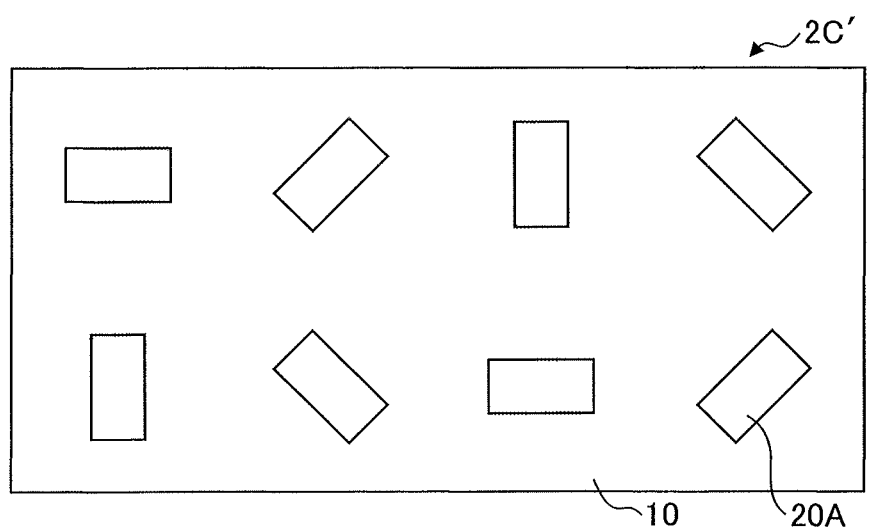

FIG. 21A to FIG. 21C are top views illustrating arrangement examples of the rectangular light-emitting units on the substrate. In these drawings, light-emitting apparatuses 2A' to 2C' including four types of the light-emitting units 20A illustrated in FIG. 20C in which the difference Δθ between the arrangement angles is 45° are illustrated. In the light-emitting apparatus 2A' of FIG. 21A, four light-emitting units 20A whose arrangement angles with respect to the side of the substrate 10 are different from one another are arranged in two rows and two columns on the substrate 10. In the light-emitting apparatus 2B' of FIG. 21B, the same four light-emitting units 20A are arranged laterally in a row on the substrate 10, and in the light-emitting apparatus 2C' of FIG. 21C, a total of eight light-emitting units 20A, in which pairs of light-emitting units 20A respectively have the same arrangement angles, are arranged in two rows and four columns in a lattice pattern. In the light-emitting apparatus 2A', the light-emitting units 20A are arranged at equal intervals such that the centers (gravities) G of the respective light-emitting regions are located on four corners of a square indicated by the dotted line in the drawing, and this is the same as in the light-emitting apparatuses 2B', 2C'.

Also in the case of the light-emitting apparatus which has light-emitting units having rectangular light-emitting regions, similarly, when the number of the light-emitting units 20A is n, preferably, the arrangement angles of the respective light-emitting units 20A with respect to the reference direction, such as the side of the substrate 10, are different from one another by 90°/n. Alternatively, a plurality of light-emitting units 20A having the same arrangement angle may be included in one light-emitting apparatus, and in this case, when the number of the light-emitting unit groups is m, preferably, the arrangement angles of the respective light-emitting unit groups with respect to the reference direction are different from one another by 90°/m.

It is to be noted that the respective light-emitting units in the light-emitting apparatus may be configured by one light-emitting element unlike the above description. For example, when configuring a light-emitting apparatus by mounting a plurality of surface-mount LED packages on one substrate, a part of the LED packages may be mounted to be inclined with respect to a side of the substrate by an angle different from that of other LED packages. Also in this case, an image obtained by overlapping beams of emission light from the respective LED packages approximates to a circular shape, and a rectangular outline of light and dark on a radiation surface does not easily appear.

The preceding description is merely to illustrate and describe exemplary embodiments of the present invention. It is not intended to be exhaustive or limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, the invention is not limited to the particular embodiment disclosed as the best mode contemplated for carrying out this invention, but the invention includes all embodiments falling within the scope of the claims. The invention may be practiced otherwise than is specifically explained and illustrated without departing from its spirit or scope.

What is claimed is:

1. A light-emitting apparatus comprising:
a rectangular substrate;
a plurality of light-emitting units each having a plurality of LED elements mounted on the substrate in a rectangular lattice pattern, wherein each of the light-emitting units has a rectangular light-emitting region, and the light-emitting units are arranged in a rectangular lattice pattern including at least two columns and at least two rows that are parallel with sides of the substrate; and
a lens array including a plurality of lenses provided corresponding to the light-emitting units, respectively, the lens array being arranged on the plurality of light-emitting units, wherein
the plurality of lenses is designed such that beams of emission light from the plurality of light-emitting units are collected and radiated so as to overlap with one another at a position distant from the substrate,
a first subset of the plurality of light-emitting units arranged at a first angle with respect to a reference direction in a plane of the substrate, and
a second subset of the plurality of light-emitting units arranged at a second angle with respect to the reference direction in the plane of the substrate, the second angle being different than the first angle,
wherein each of the at least two columns and each of the at least two rows includes at least one light-emitting unit of the first subset and at least one light-emitting unit of the second subset,
wherein the plurality of light-emitting units is arranged on the substrate such that centers of the respective light-emitting units are arranged at equal intervals, and
wherein the rectangular lattice pattern, the first angle and the second angle of plurality of light-emitting units are predetermined such that the beams of emission light overlap to produce an approximation of a circular shape at the position distant from the substrate.

2. The light-emitting apparatus according to claim 1, wherein
the LED elements are mounted in a rectangular mount region on the substrate, and are series-parallel connected to one another in each of the light-emitting units,
each of the light-emitting units further has a sealing resin that is filled on the mount region to seal the plurality of LED elements, the sealing resin containing a phosphor to be excited by the plurality of LED elements, and
the light-emitting region is a region covered with the sealing resin.

3. The light-emitting apparatus according to claim 1, wherein, when the number of the light-emitting units is n, arrangement angles of the respective light-emitting units with respect to the reference direction are different from one another by 90°/n.

4. The light-emitting apparatus according to claim 1, wherein, when light-emitting units having the same arrangement angle with respect to the reference direction among the plurality of light-emitting units are defined as one light-emitting unit group and the number of light-emitting unit groups included in the plurality of light-emitting units is m, arrangement angles of the respective light-emitting unit groups with respect to the reference direction are different from one another by 90°/m.

5. The light-emitting apparatus according to claim 1, wherein, when a direction parallel with the reference direction is defined as 0° and a direction perpendicular to the reference direction in the plane of the substrate is defined as 90°, there are equal intervals between 0°, an arrangement angle of the light-emitting units arranged to be inclined with respect to the reference direction among the plurality of light-emitting units, and 90°.

6. The light-emitting apparatus according to claim 5, wherein
- a part of the plurality of light-emitting units is arranged along a direction of 45° with respect to the reference direction, and
- the rest of the plurality of light-emitting units is arranged in parallel with the reference direction.

7. The light-emitting apparatus according to claim 6, wherein the light-emitting units inclined with respect to the reference direction by 45° and the light-emitting units parallel with the reference direction are alternately arranged so as to form a checkered pattern on the substrate.

8. The light-emitting apparatus according to claim 1, wherein the light-emitting units have the same number and arrangement of the LED elements as one another, and also have the same shape and size of the light-emitting region as one another.

9. The light-emitting apparatus according to claim 1, wherein
- the light-emitting units are arranged in a rectangular lattice pattern including at least three columns and at least three rows, and
- the light-emitting units of the first subset and the light-emitting units of the second subset alternate throughout the rows and the columns.

\* \* \* \* \*